(12) United States Patent
Lee

(10) Patent No.: US 9,478,748 B2
(45) Date of Patent: Oct. 25, 2016

(54) ORGANIC LIGHT EMITTING DIODE DEVICE

(71) Applicant: SAMSUNG DISPLAY CO., LTD., Yongin, Gyeonggi-Do (KR)

(72) Inventor: Jae-Yong Lee, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 496 days.

(21) Appl. No.: 14/108,440

(22) Filed: Dec. 17, 2013

(65) Prior Publication Data

US 2015/0001489 A1 Jan. 1, 2015

(30) Foreign Application Priority Data

Jul. 1, 2013 (KR) .................. 10-2013-0076672

(51) Int. Cl.
 *H01L 51/50* (2006.01)
 *H01L 51/00* (2006.01)
 *C09K 11/06* (2006.01)

(52) U.S. Cl.
 CPC .......... *H01L 51/0054* (2013.01); *C09K 11/06* (2013.01); *H01L 51/0067* (2013.01);
 (Continued)

(58) Field of Classification Search
 CPC .......... C09K 11/06; C09K 2211/1416; C09K 2211/1458; H01L 2251/5384; H01L 51/0054; H01L 51/0058; H01L 51/006; H01L 51/0067; H01L 51/0072; H01L 51/0074; H01L 51/0094; H01L 51/5016
 See application file for complete search history.

(56) References Cited

U.S. PATENT DOCUMENTS 8,968,887 B2 * 3/2015 Ma .................. C09K 11/06
 428/690

2012/0211701 A1 * 8/2012 Spreitzer ............... C07B 59/00
 252/301.16

(Continued)

FOREIGN PATENT DOCUMENTS

KR 10-2011-0077909 A 7/2011
KR 10-2011-0078484 A 7/2011

(Continued)

*Primary Examiner* — Dawn Garrett
(74) *Attorney, Agent, or Firm* — Lee & Morse, P.C.

(57) ABSTRACT

An organic light emitting diode display including an anode; a cathode facing the anode; and an emission layer between the anode and the cathode, wherein the emission layer includes a compound represented by Chemical Formula 1, below, and a compound represented by Chemical Formula 2, below:

[Chemical Formula 1]

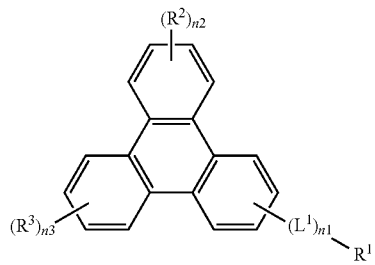

[Chemical Formula 2]

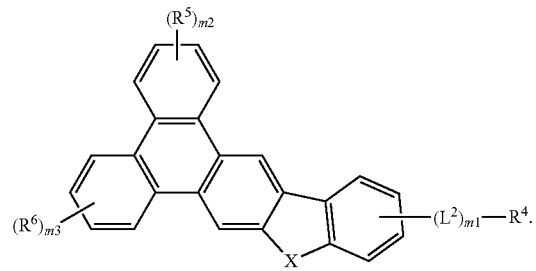

13 Claims, 2 Drawing Sheets

(52) U.S. Cl.
CPC ....... *H01L51/0072* (2013.01); *H01L 51/0074* (2013.01); *C09K 2211/1416* (2013.01); *C09K 2211/1458* (2013.01); *H01L 51/006* (2013.01); *H01L 51/0058* (2013.01); *H01L 51/0094* (2013.01); *H01L 51/5016* (2013.01); *H01L 2251/5384* (2013.01)

(56) References Cited

U.S. PATENT DOCUMENTS

2013/0048975 A1* 2/2013 Hong ................. C07D 209/80 257/40

2014/0166988 A1* 6/2014 Yen ..................... H01L 51/0058 257/40

FOREIGN PATENT DOCUMENTS

| KR | 10-2011-0130904 A | 12/2011 |
| KR | 10-2013-0007934 A | 1/2013 |
| KR | 10-2013-0007951 A | 1/2013 |

\* cited by examiner

ORGANIC LIGHT EMITTING DIODE DEVICE

CROSS-REFERENCE TO RELATED APPLICATION

Korean Patent Application No. 10-2013-0076672, filed on Jul. 1, 2013, in the Korean Intellectual Property Office, and entitled: "Organic Light Emitting Diode Device," is incorporated by reference herein in its entirety.

BACKGROUND

1. Field

Embodiments relate to an organic light emitting diode device.

2. Description of the Related Art

Monitors and televisions have been reduced in weight and thickness, and accordingly, a cathode ray tube (CRT) has been replaced with a liquid crystal display (LCD). However, as a non-emissive element, the LCD uses an additional backlight and also has limits in response speed and viewing angle.

As a display device that can overcome such a limit, an organic light emitting diode display having a wide viewing angle, excellent contrast, and quick response time has been highlighted. The organic light emitting diode display is a self-emissive display element.

The organic light emitting diode device may form excitons from combination of electrons injected from one electrode and holes injected from another electrode in an emission layer, and the excitons may emit energy in the form of light.

The above information disclosed in this Background section is only for enhancement of understanding of the background and therefore it may contain information that does not form the prior art that is already known to a person of ordinary skill in the art.

SUMMARY

Embodiments are directed to an organic light emitting diode device.

The embodiments may be realized by providing an organic light emitting diode display including an anode; a cathode facing the anode; and an emission layer between the anode and the cathode, wherein the emission layer includes a compound represented by Chemical Formula 1, below, and a compound represented by Chemical Formula 2, below:

[Chemical Formula 1]

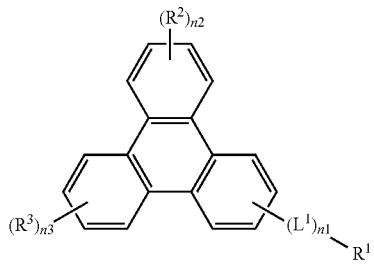

wherein, in Chemical Formula 1, $L^1$ is a substituted or unsubstituted C6 to C30 arylene group or a substituted or unsubstituted C2 to C30 heteroarylene group, $R^1$ is hydrogen, deuterium, a substituted or unsubstituted C6 to C30 aryl group, a substituted or unsubstituted C2 to C30 heteroaryl group, a substituted or unsubstituted C1 to C30 amine group, or a substituted or unsubstituted silyl group, $R^2$ and $R^3$ are each independently hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C1 to C30 amine group, or a substituted or unsubstituted silyl group, n1 is an integer from 0 to 2, and n2 and n3 are independently integers from 0 to 4,

[Chemical Formula 2]

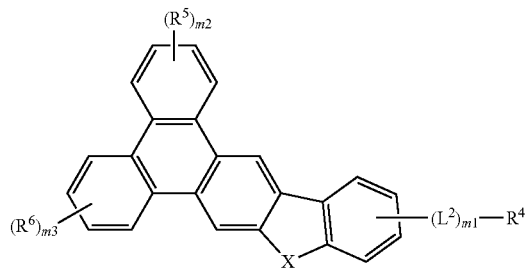

wherein, in Chemical Formula 2, X is NR, O, or S, in which R is hydrogen, deuterium, a substituted or unsubstituted C1 to C30 alkyl group, a substituted or unsubstituted C6 to C30 aryl group, or a substituted or unsubstituted C2 to C30 heteroaryl group, $R^4$ to $R^6$ are each independently hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C1 to C30 amine group, or a substituted or unsubstituted silyl group, $L^2$ is a substituted or unsubstituted C6 to C30 arylene group or a substituted or unsubstituted C2 to C30 heteroarylene group, m1 is an integer from 0 to 2, and m2 and m3 are each independently integers from 0 to 4.

$L^1$ may be a substituted or unsubstituted C6 to C30 arylene group, and n2 and n3 may be 0.

$L^1$ may be a substituted or unsubstituted phenylene group or a substituted or unsubstituted naphthalene group.

m2 and m3 may be 0.

R may be a substituted or unsubstituted phenyl group, a substituted or unsubstituted pyridinyl group, substituted or unsubstituted pyrimidinyl group, or a substituted or unsubstituted 1,3,5-triazinyl group.

$R^4$ may be a substituted or unsubstituted pyridinyl group, a substituted or unsubstituted pyrimidinyl group, or a substituted or unsubstituted 1,3,5-triazinyl group.

The compound represented by Chemical Formula 1 may be represented by one of Chemical Formula 1-1 to Chemical Formula 1-24, below:

[1-1]

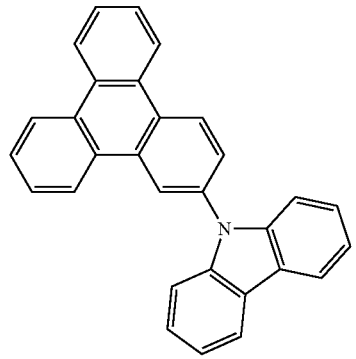

[1-2]
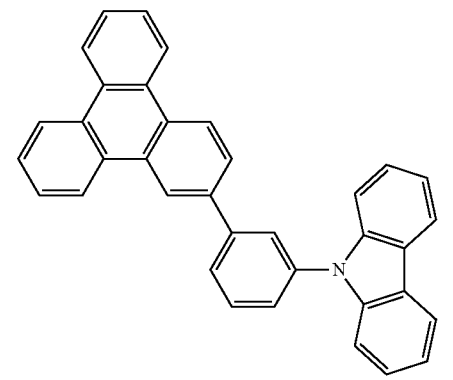
[1-3]
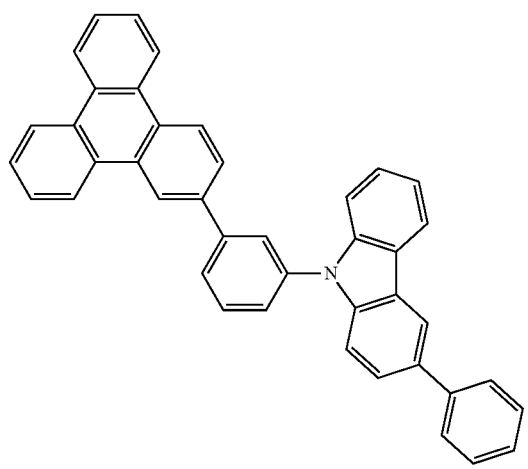
[1-4]
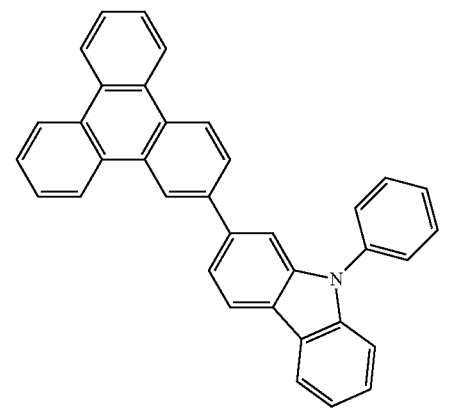
[1-5]
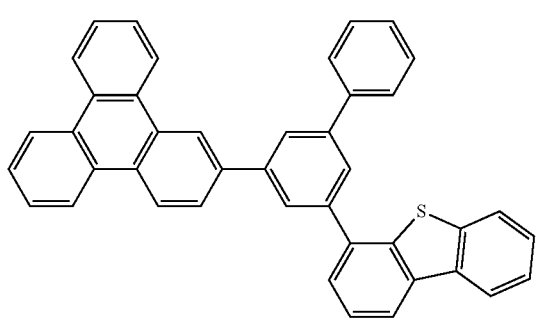
[1-6]
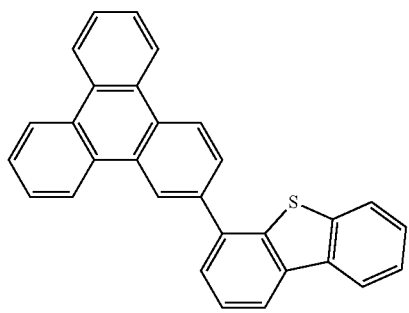
[1-7]
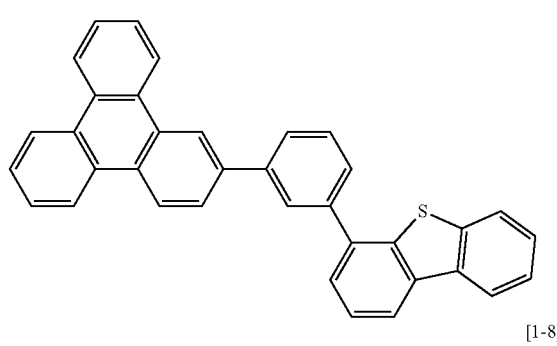
[1-8]
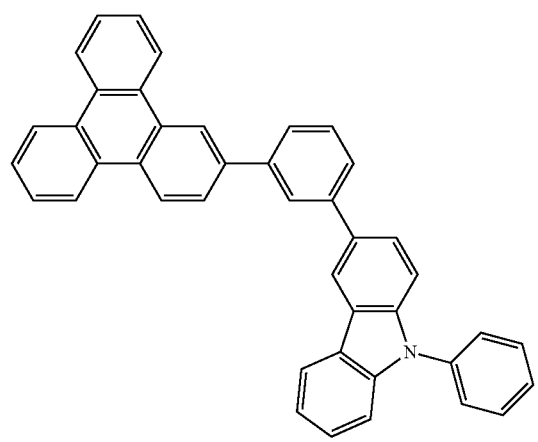
[1-9]
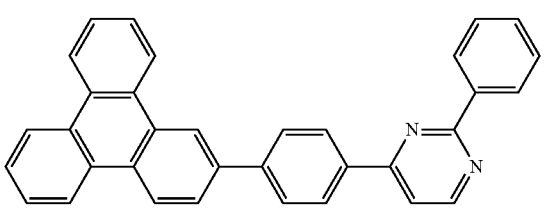
[1-10]
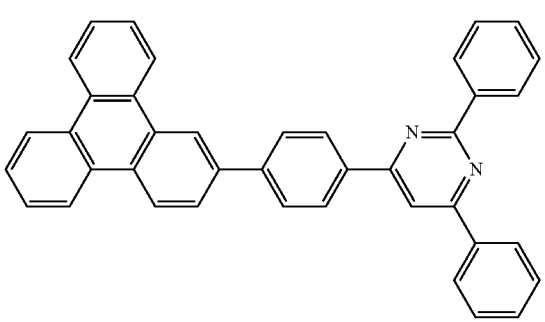

[1-11]
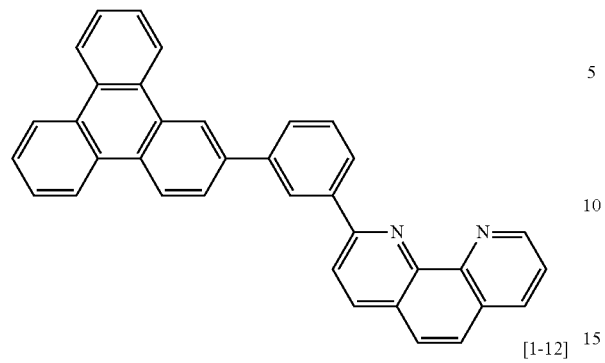
[1-12]
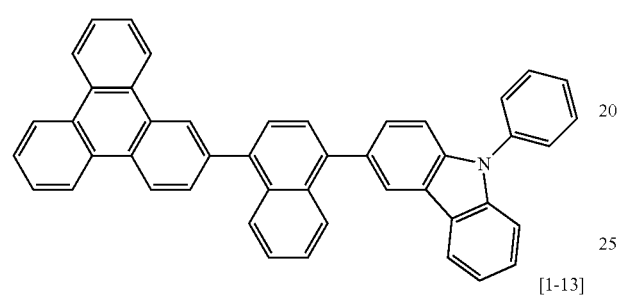
[1-13]
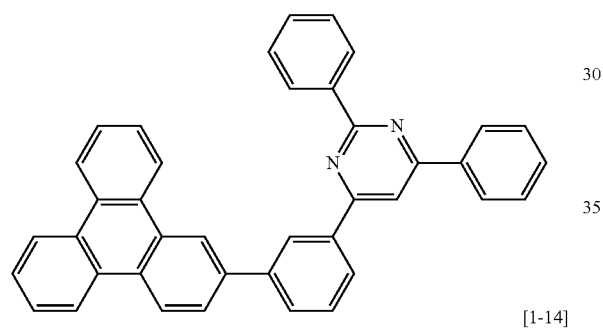
[1-14]
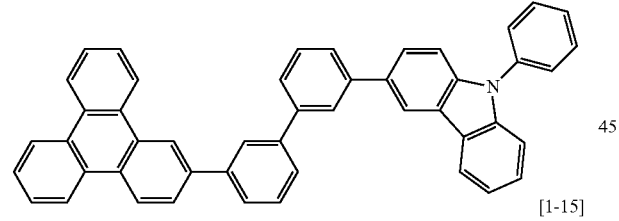
[1-15]
[1-16]
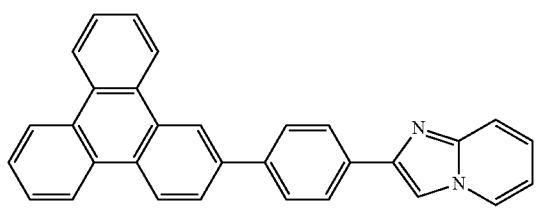
[1-17]
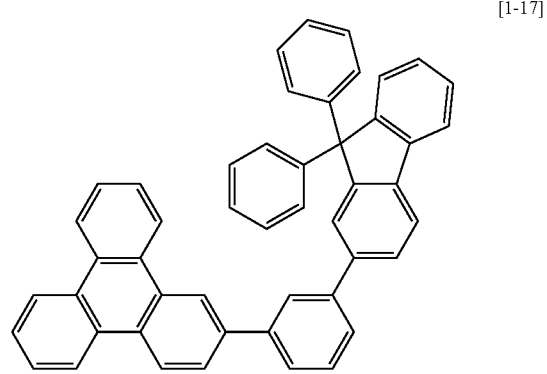
[1-18]
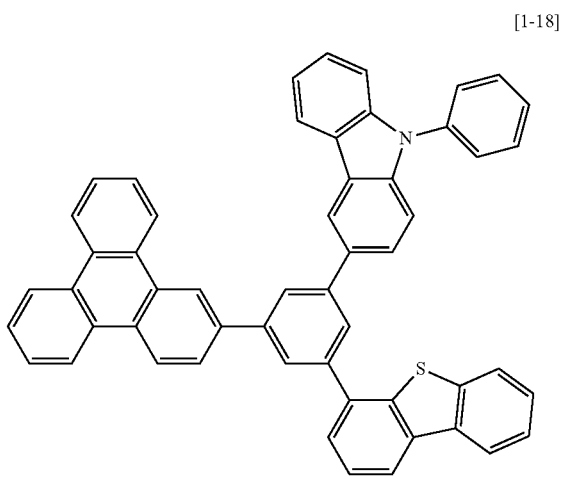
[1-19]
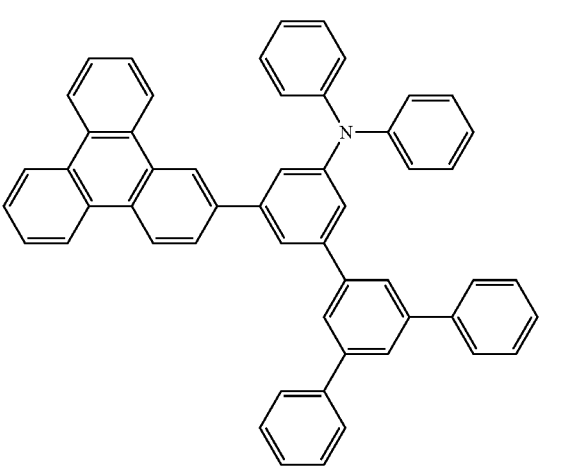

-continued
[1-20]
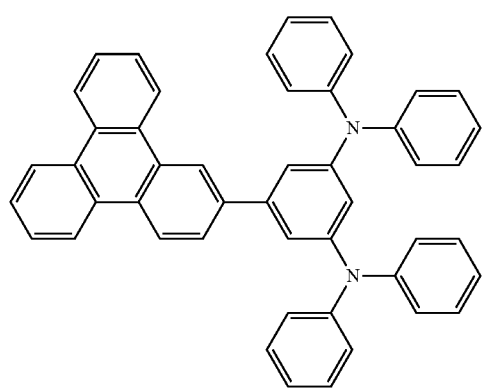
[1-21]
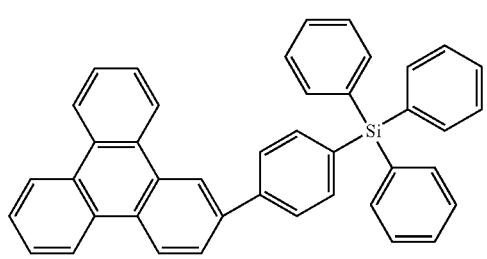
[1-22]
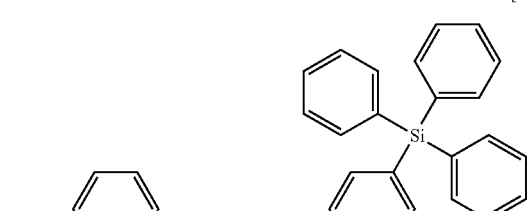
[1-23]
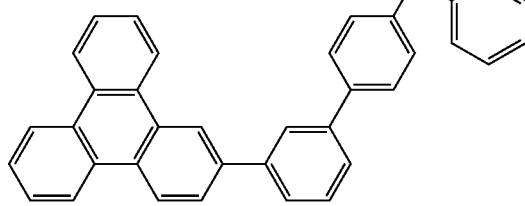
[1-24]
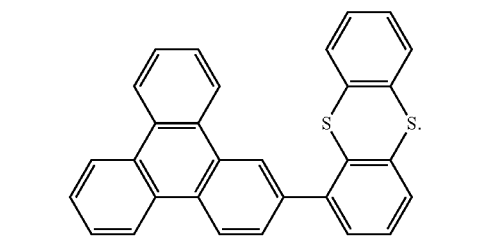
The compound represented by Chemical Formula 2 may be represented by one of Chemical Formula 2-1 to Chemical Formula 2-20, below:
[2-1]
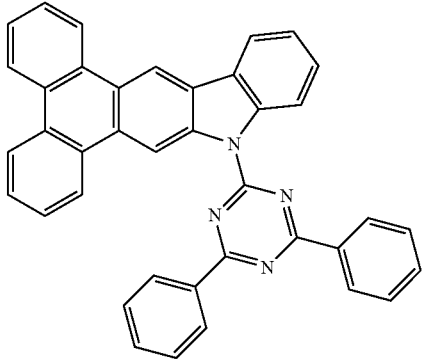
[2-2]
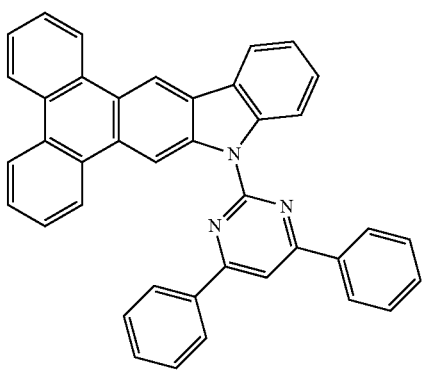
[2-3]
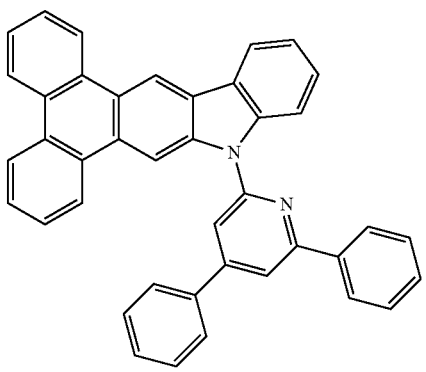
[2-4]
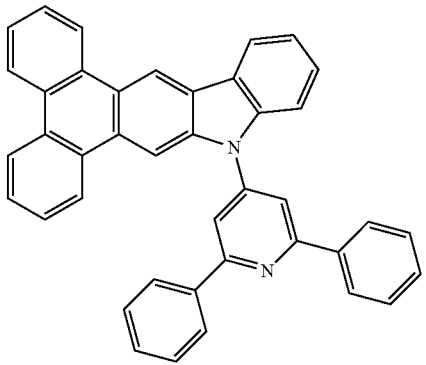

[2-5]
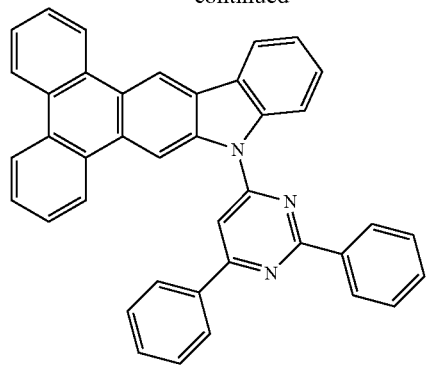
[2-6]
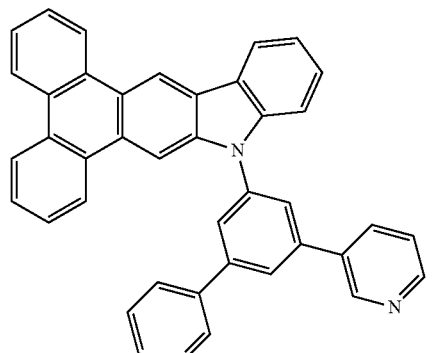
[2-7]
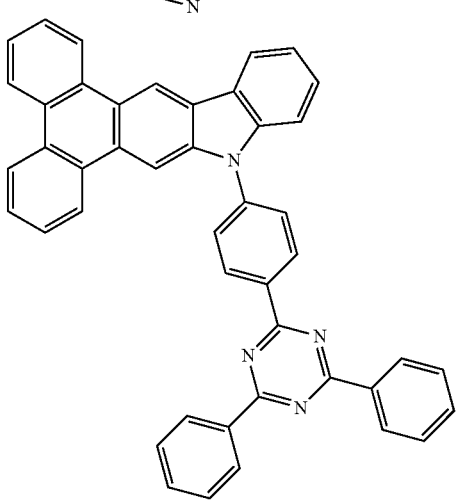
[2-8]
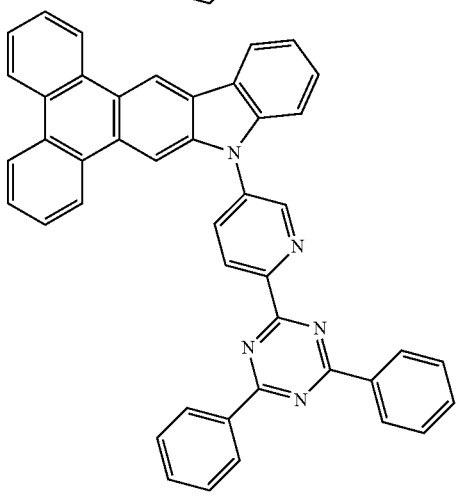
[2-9]
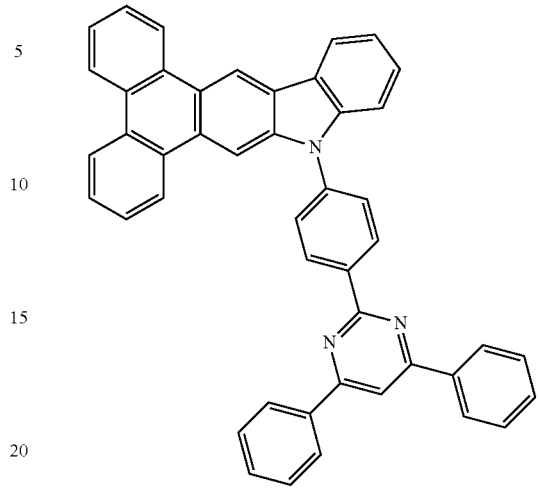
[2-10]
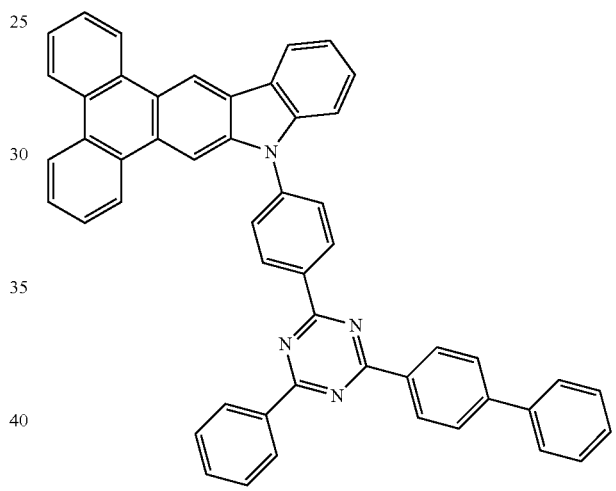
[2-11]
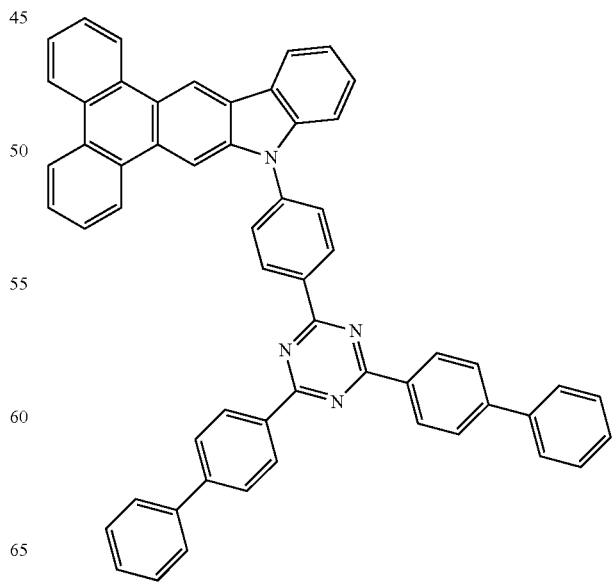

[2-12]
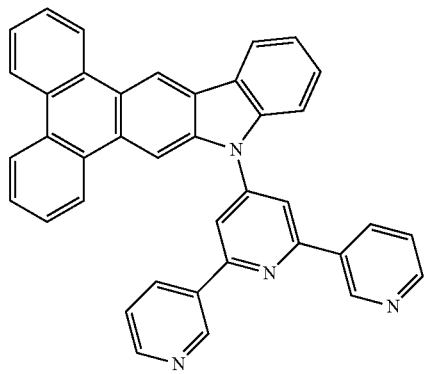
[2-13]
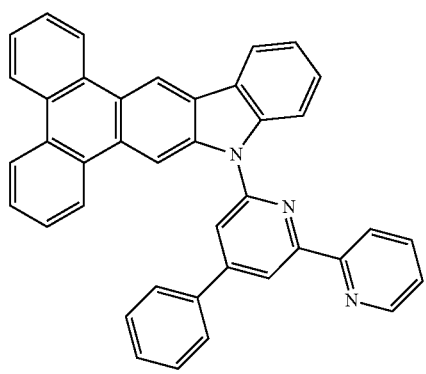
[2-14]
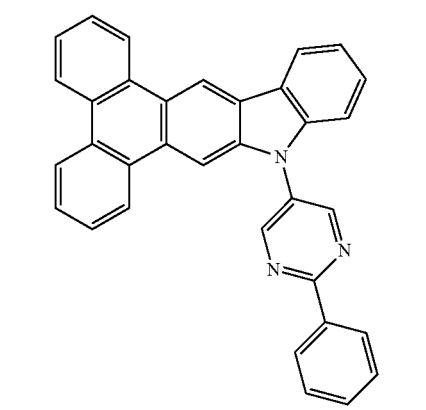
[2-15]
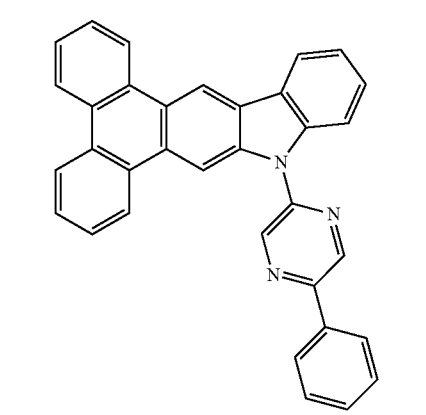
[2-16]
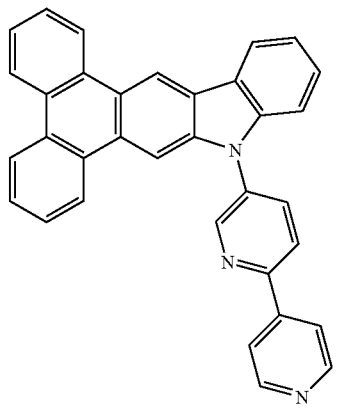
[2-17]
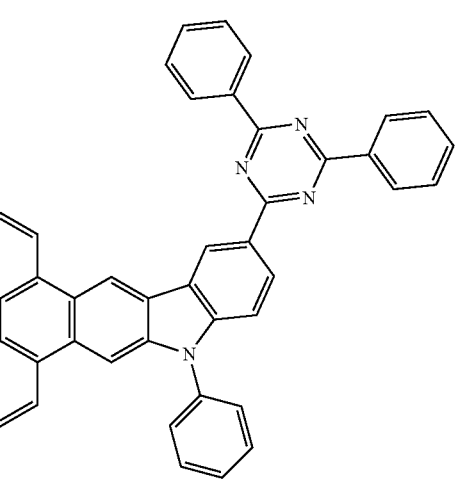
[2-18]
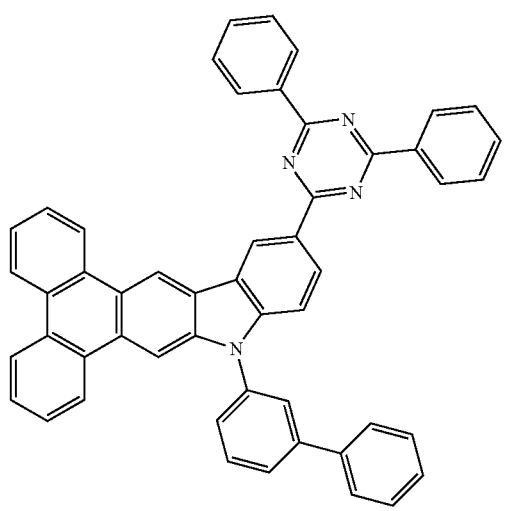

-continued

[2-19]

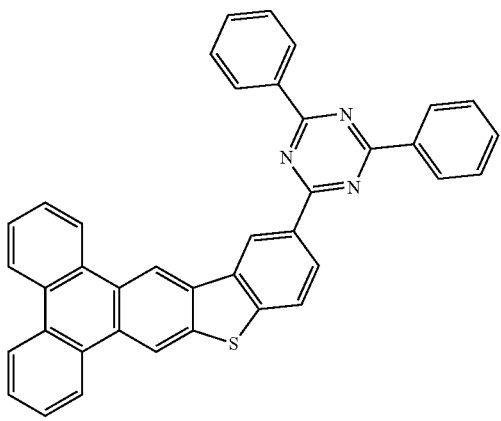

[2-20]

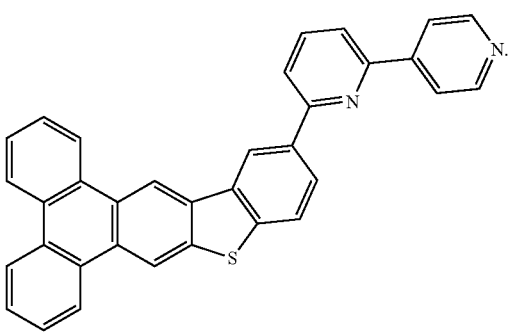

The emission layer may include the compound represented by Chemical Formula 1 and the compound represented by Chemical Formula 2 as host materials, and may further include a dopant material.

The dopant material may include a phosphorescent dopant material.

The compound represented by Chemical Formula 1 and the compound represented by Chemical Formula 2 may be present in the emission layer in a weight ratio of about 1:9 to about 9:1.

The host material and the dopant material may be included in the emission layer in a weight ratio of about 6:4 to about 9:1.

The compound represented by Chemical Formula 1, the compound represented by Chemical Formula 2, and the dopant material may be included in the emission layer in a weight ratio of about 5:4:1 to about 7:2:1.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
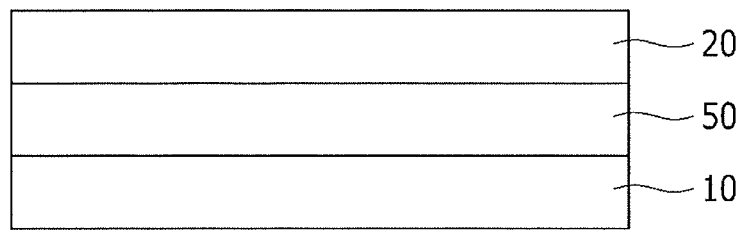
FIGS. 1 to 3 illustrate structures of organic light emitting diode devices according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In addition, it will also be understood that when a layer is referred to as being "between" two layers, it can be the only layer between the two layers, or one or more intervening layers may also be present.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the specification, a hole characteristic implies a characteristic having a conductive characteristic according to a HOMO level and thus holes formed in the positive electrode can be easily injected into an emission layer and easily moved in the emission layer. In further detail, it may be similar to a characteristic of electron-pushing.

In the specification, an electron characteristic implies a characteristic having a conductive characteristic according to a HOMO level and thus electrons formed in negative electrode can be easily injected into the emission layer and easily moved in the emission layer. In further detail, the electron characteristic may similar to a characteristic of electron-pulling.

Hereinafter, an organic light emitting diode device according to an exemplary embodiment will be described in further detail.

Figure 2:
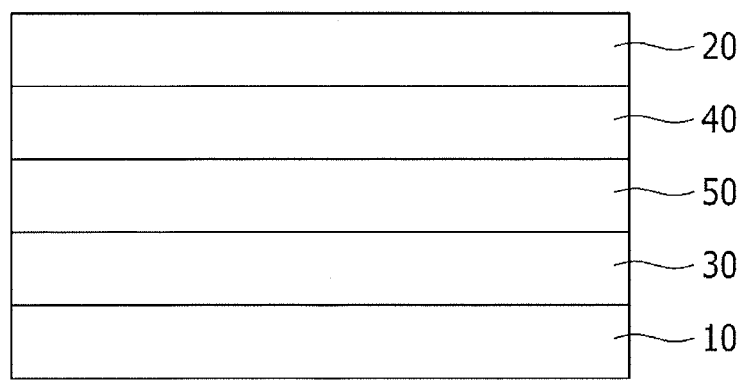
Figure 3:
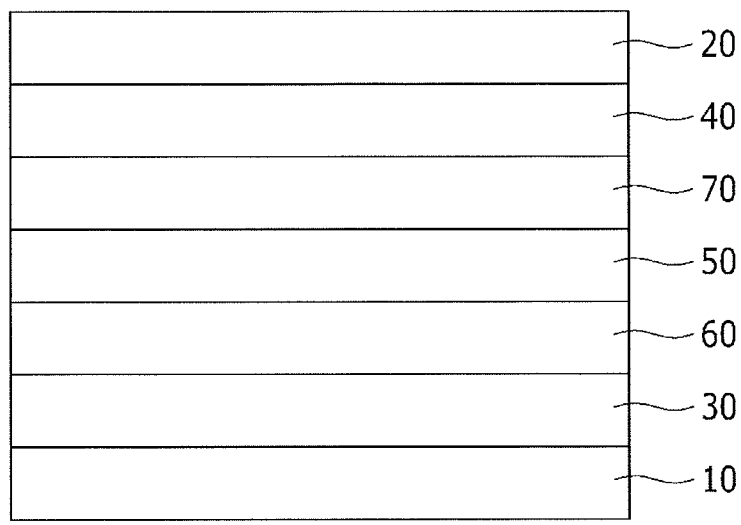

FIG. 1 to FIG. 3 illustrate cross-sectional views of an organic light emitting diode device according to an exemplary embodiment.

Referring to FIG. 1, an organic light emitting diode device according to the exemplary embodiment may include an anode 10, a cathode 20 facing the anode 10, and an emission layer 50 between the anode 10 and the cathode 20.

A substrate (not shown) may be disposed on the anode 10 or the cathode 20. The substrate may be made of an inorganic material such as glass, an organic material such as polycarbonate, polymethylmethacrylate, polyethyleneterephthalate, polyethylene naphthalate, polyamide, polyether sulfone, or a combination thereof, or a silicon wafer.

The anode 10 may be a transparent electrode or an opaque electrode. The transparent electrode may be, e.g., formed of a conductive oxide such as indium tin oxide (ITO), indium zinc oxide (IZO), tin oxide ($SnO_2$), zinc oxide (ZnO), or combination thereof, or a metal such as aluminum, silver, magnesium in a thin thickness, and the opaque electrode may be, e.g., formed of a metal such as aluminum, silver, and magnesium.

The cathode 20 may include a material having a low work function for easy electron injection. For example, the material may be a metal such as magnesium, calcium, sodium, potassium, titanium, indium, yttrium, lithium, gadolinium, aluminum, silver, tin, lead, cesium, barium, and the like, or an alloy thereof, or a multi-layered structure material such as LiF/Al, $LiO_2$/Al, LiF/Ca, LiF/Al, and $BaF_2$/Ca. In an implementation, a metal electrode such as aluminum may be used as the cathode.

The emission layer 50 may include a compound represented by Chemical Formula 1 and a compound represented by Chemical Formula 2.

[Chemical Formula 1]

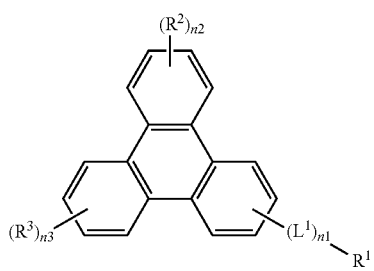

In Chemical Formula 1, $L^1$ may be a substituted or unsubstituted C6 to C30 arylene group or a substituted or unsubstituted C2 to C30 heteroarylene group, $R^1$ may be hydrogen, deuterium, a substituted or unsubstituted C6 to C30 aryl group, a substituted or unsubstituted C2 to C30 heteroaryl group, a substituted or unsubstituted C1 to C30 amine group, or a substituted or unsubstituted silyl group, $R^2$ and $R^3$ may each independently be hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 hetroaryl group, a substituted or unsubstituted C1 to C30 amine group, or a substituted or unsubstituted silyl group, n1 may be an integer between 0 to 2, and n2 and n3 may each independently be integers from 0 to 4. In an implementation, $R^1$ may be a thianthrenyl group.

[Chemical Formula 2]

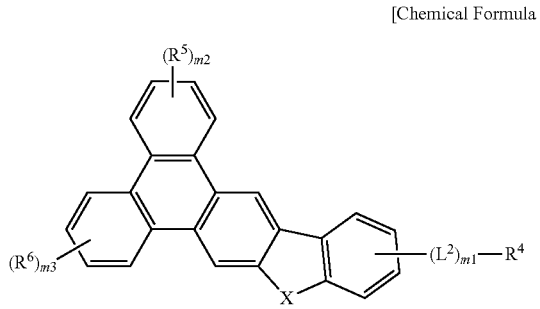

In Chemical Formula 2, X may be NR, O, or S, in which R is hydrogen, deuterium, a C1 to C30 alkyl group, a C6 to C30 aryl group, or a C2 to C30 heteroaryl group. In an implementation, R may be hydrogen, deuterium, a substituted or unsubstituted C1 to C30 alkyl group, a substituted or unsubstituted C6 to C30 aryl group, or a substituted or unsubstituted C2 to C30 heteroaryl group. $R^4$ to $R^6$ may each independently be hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C1 to C30 amine group, or a substituted or unsubstituted silyl group, $L^2$ may be a substituted or unsubstituted C6 to C30 arylene group or a substituted or unsubstituted C2 to C30 heteroarylene group. m1 may be an integer from 0 to 2, and m2 and m3 may each independently be integers from 0 to 4.

A compound represented by Chemical Formula 1 may have a wide band gap. If the compound were to solely be used as a light emission host material, a hole characteristic and an electron characteristic may deteriorate so that a current-voltage characteristic may be deteriorated. Accordingly, a driving voltage may be increased, thereby causing increase of power consumption of the organic light emitting diode display. However, the compound represented by Chemical Formula 1 may have a laminated structure, so that the compound may not easily be broken by a reduction reaction, and may have a T1 energy level of about 2.6 eV. Thus, the compound may be appropriately used as an excellent phosphorescent host when being vacuum-deposited with the compound represented by Chemical Formula 2.

In addition, the compound represented by Chemical Formula 2 may have excellent hole and electron injection and mobility characteristic, e.g., may have excellent hole characteristics and electron characteristics. When used as a light emission host material together with the compound represented by Chemical Formula 1, electronic stress applied to the emission layer may be released so that the life-span of the organic light emitting diode display may be improved and a low-voltage and high-efficiency characteristic may be achieved.

In an implementation, in Chemical Formula 1, $L^1$ may be a substituted or unsubstituted C6 to C30 arylene group, $R^1$ may be hydrogen, deuterium, a substituted or unsubstituted C6 to C30 aryl group, a substituted or unsubstituted C2 to C30 heteroaryl group, a substituted or unsubstituted C1 to C30 amine group, or a substituted or unsubstituted silyl group, n1 may be an integer between 0 to 2, and n2 and n3 may be 0.

For example, $L^1$ may be a substituted or unsubstituted phenylene group or a substituted or unsubstituted naphthalene group. In such a case, the molecule may rotate with respect to the phenylene group or the naphthalene group so that a degree of freedom of the molecule may be increased. Accordingly an amorphous characteristic of a film may be increased, and quality of the film may improve and may be excellent.

In an implementation, in Chemical Formula 2, X may be NR or S, in which R may be hydrogen, deuterium, a C1 to C30 alkyl group, a C6 to C30 aryl group, or a C2 to C30 heteroaryl group, $R^4$ may be hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C1 to C30 amine group, or a substituted or unsubstituted silyl group, $L^2$ may be a substituted or unsubstituted C6 to C30 arylene group, or a substituted or unsubstituted C2 to C30 heteroarylene group, m1 may be an integer from 0 to 2, and m2 and m3 may be 0.

For example, R may denote a substituted or unsubstituted phenyl group, a substituted or unsubstituted pyridinyl group, substituted or unsubstituted pyrimidinyl group, or a substituted or unsubstituted 1,3,5-triazinyl group. In such a case, hole and electron mobility may be excellent.

In an implementation, $R^4$ may be a substituted or unsubstituted pyridinyl group, a substituted or unsubstituted pyrimidinyl group, or a substituted or unsubstituted 1,3,5-triazinyl group. The pyridinyl group, the pyrimidinyl group, and the triazinyl group may be representative electron withdrawing groups, and may help improve electron injection and mobility.

In an implementation, the compound represented by Chemical Formula 1 may be represented by one of Chemical Formula 1-1 to Chemical Formula 1-24, below.

[1-1]
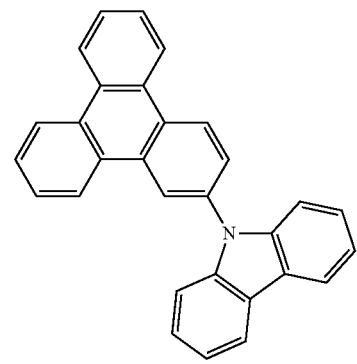
[1-2]
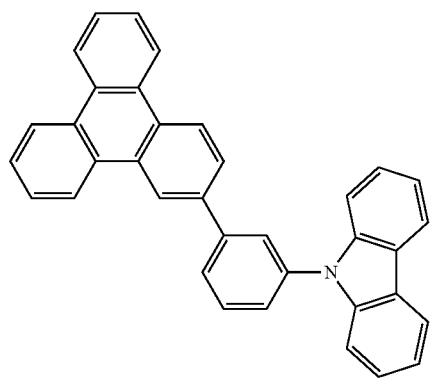
[1-3]
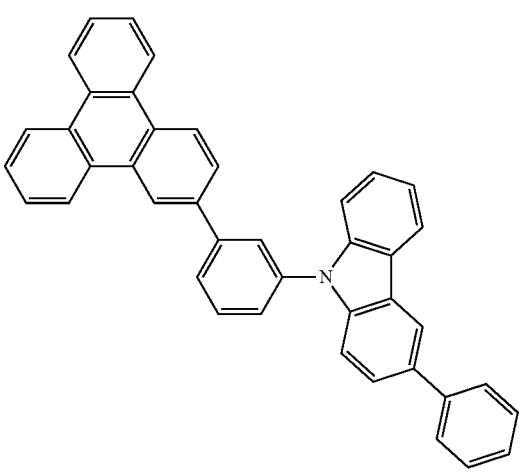
[1-4]
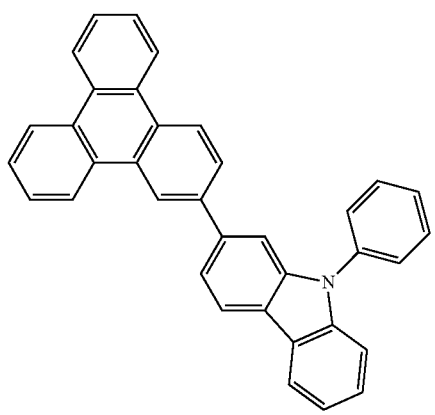
[1-5]
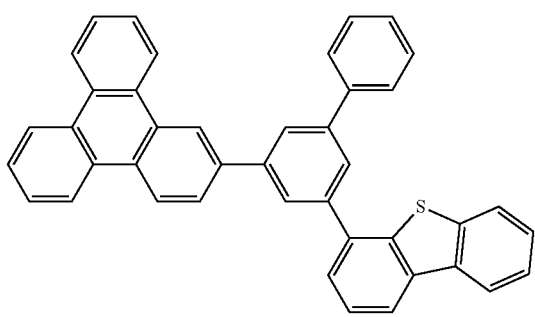
[1-6]
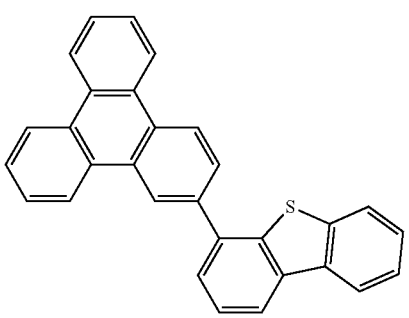
[1-7]
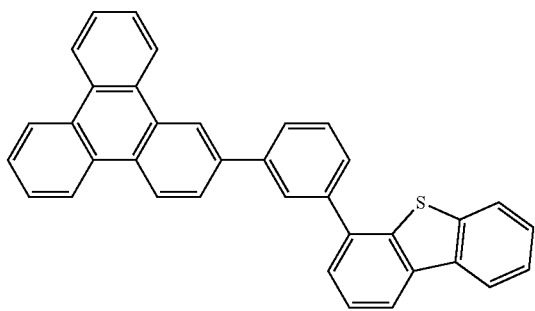
[1-8]
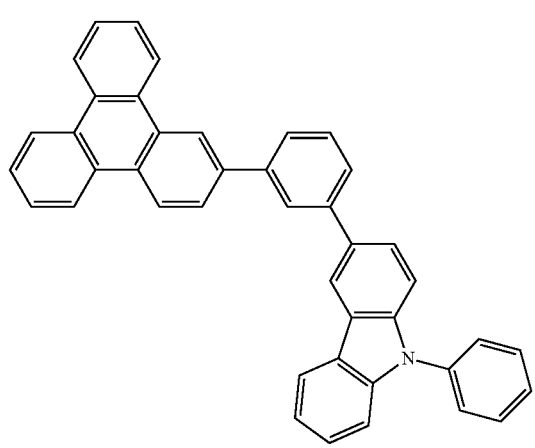

[1-9]
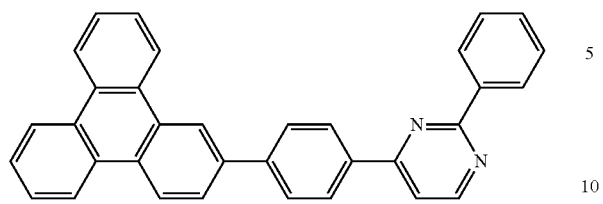
[1-10]
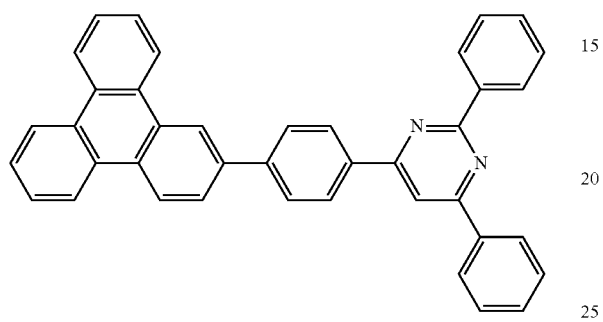
[1-11]
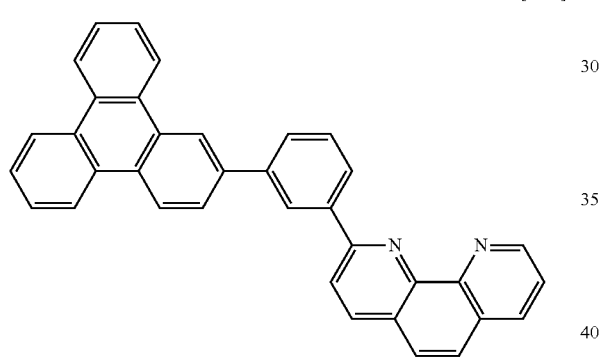
[1-12]
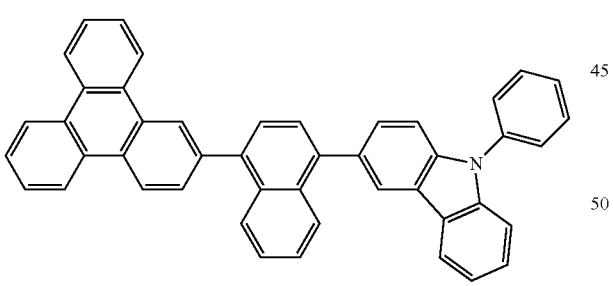
[1-13]
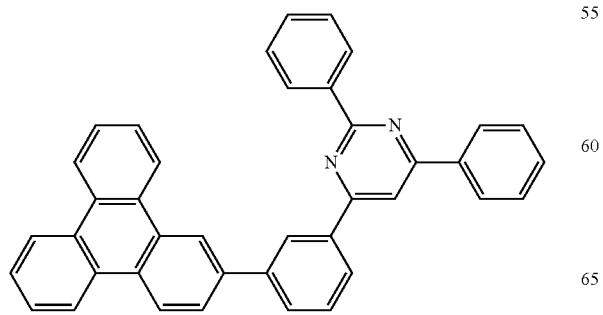
[1-14]
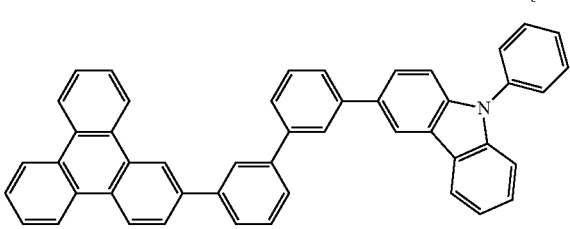
[1-15]
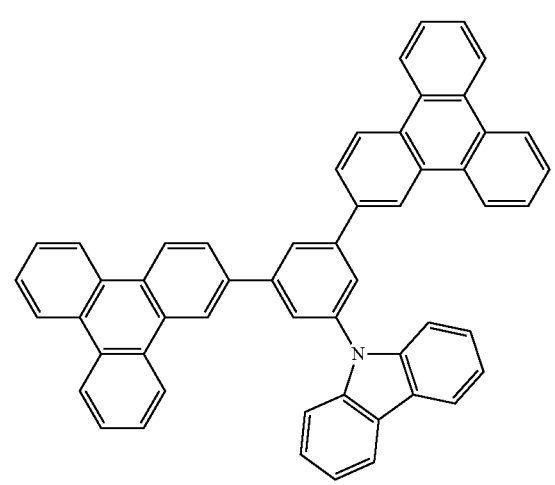
[1-16]
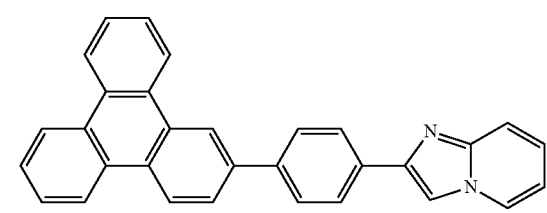
[1-17]
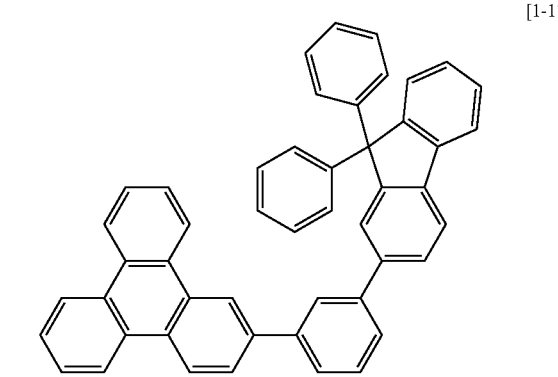

[1-18]
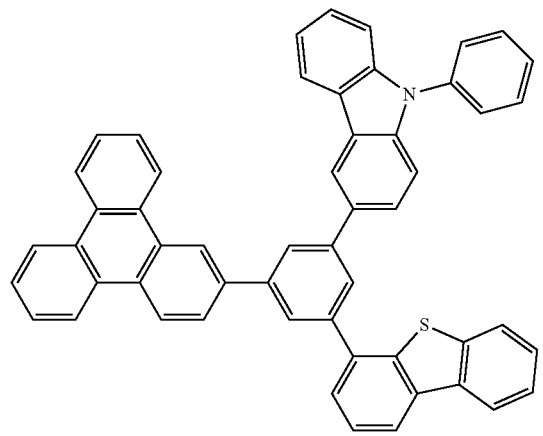
[1-19]
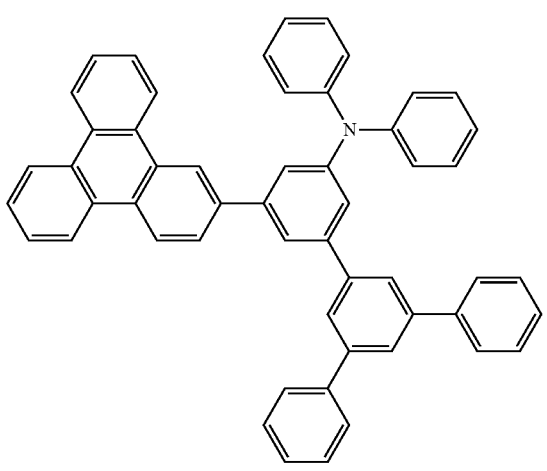
[1-20]
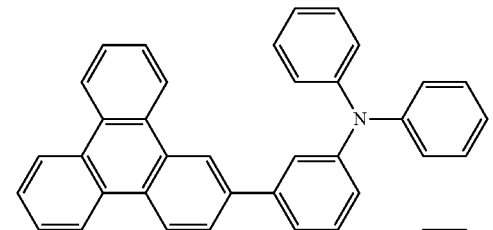
[1-21]
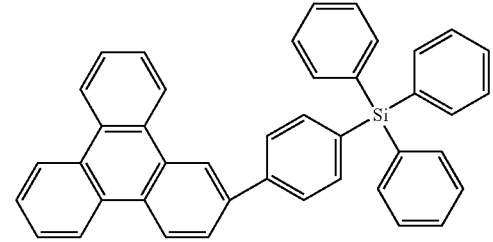
[1-22]
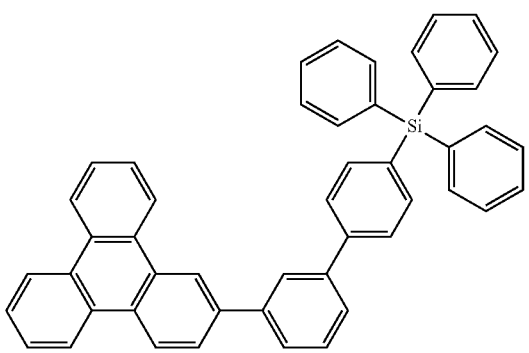
[1-23]
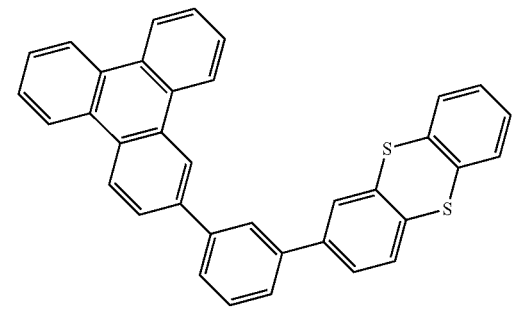
[1-24]
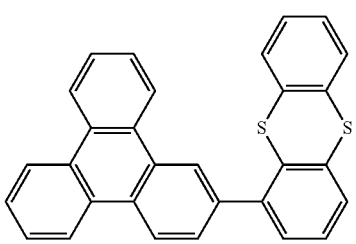
In an implementation, the compound represented by Chemical Formula 2 may be represented by one of Chemical Formula 2-1 to Chemical Formula 2-20, below.
[2-1]
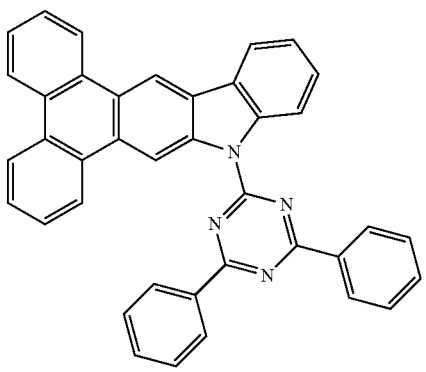

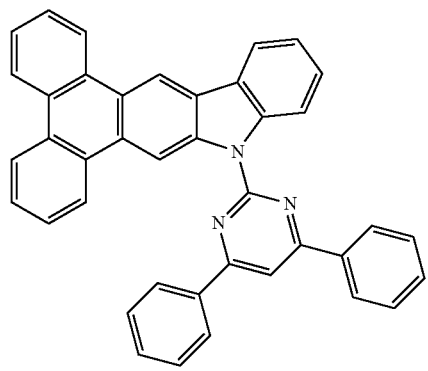 [2-2]
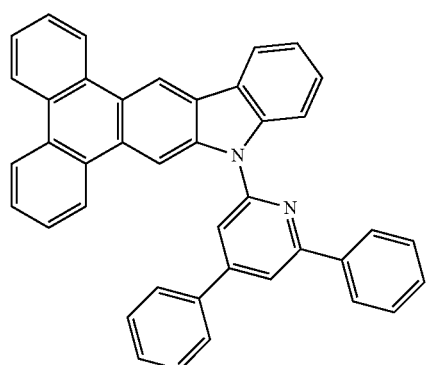 [2-3]
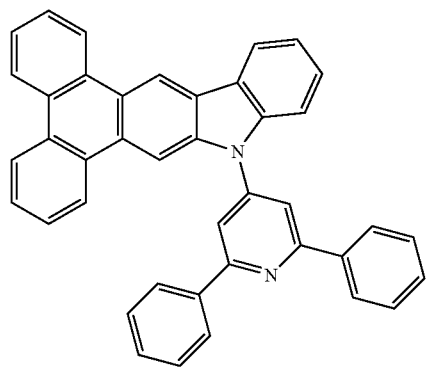 [2-4]
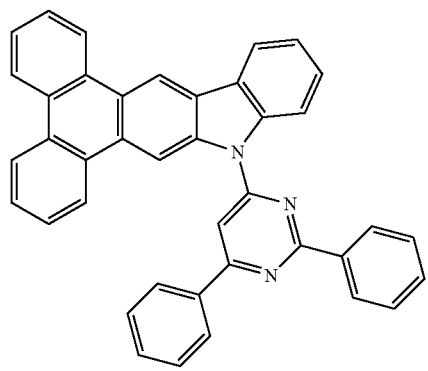 [2-5]
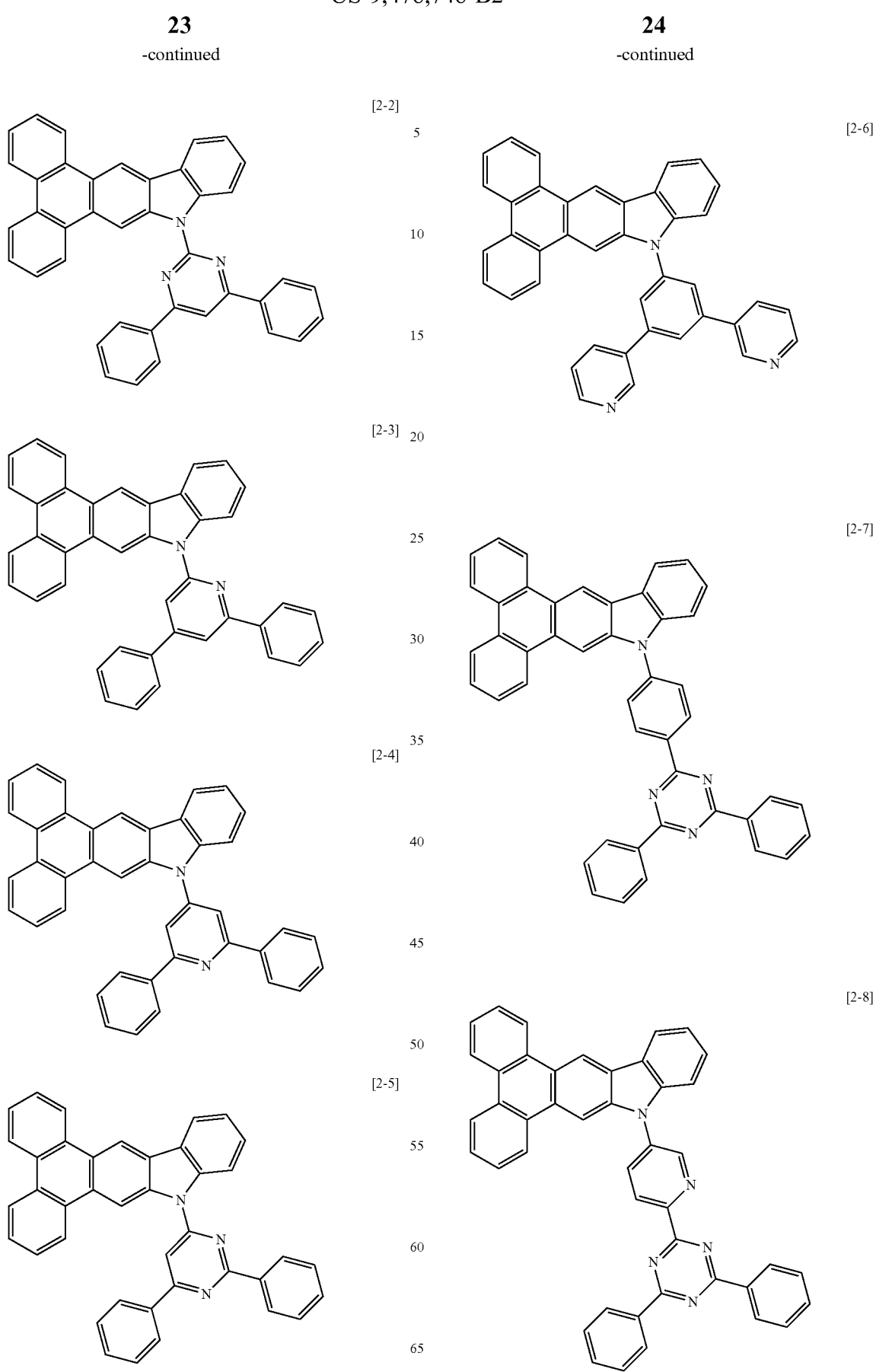

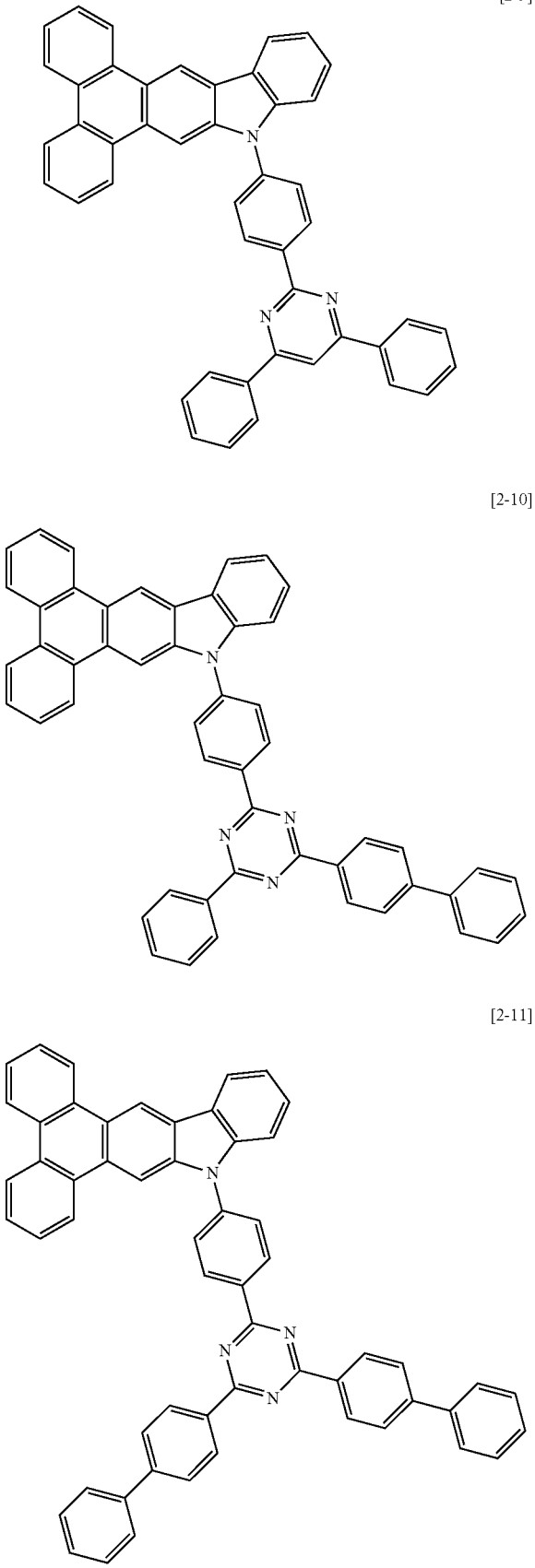 [SMILES: c1ccc(-c2cc(-c3ccccc3)nc(-c3ccc(-n4c5ccccc5c5cc6c7ccccc7c7ccccc7c6cc54)cc3)n2)cc1 ; c1ccc(-c2ccc(-c3nc(-c4ccccc4)nc(-c4ccc(-n5c6ccccc6c6cc7c8ccccc8c8ccccc8c7cc65)cc4)n3)cc2)cc1 ; c1ccc(-c2ccc(-c3nc(-c4ccc(-c5ccccc5)cc4)nc(-c4ccc(-n5c6ccccc6c6cc7c8ccccc8c8ccccc8c7cc65)cc4)n3)cc2)cc1]
[2-9]
[2-10]
[2-11]
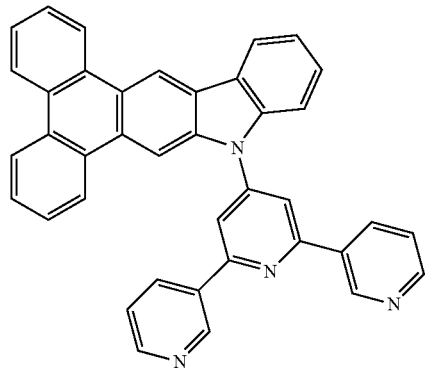
[2-12]
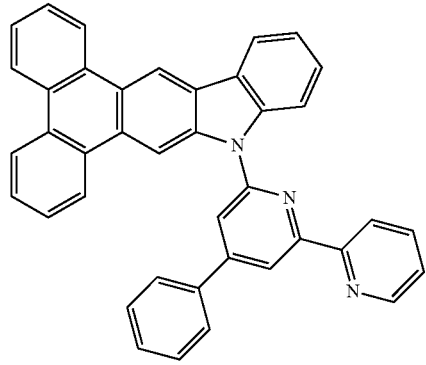
[2-13]
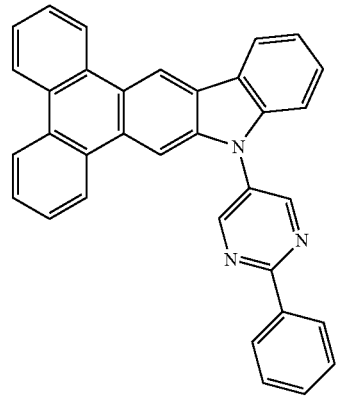
[2-14]
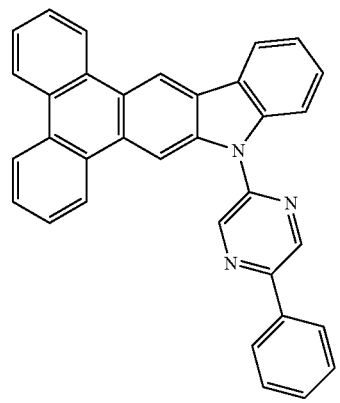
[2-15]

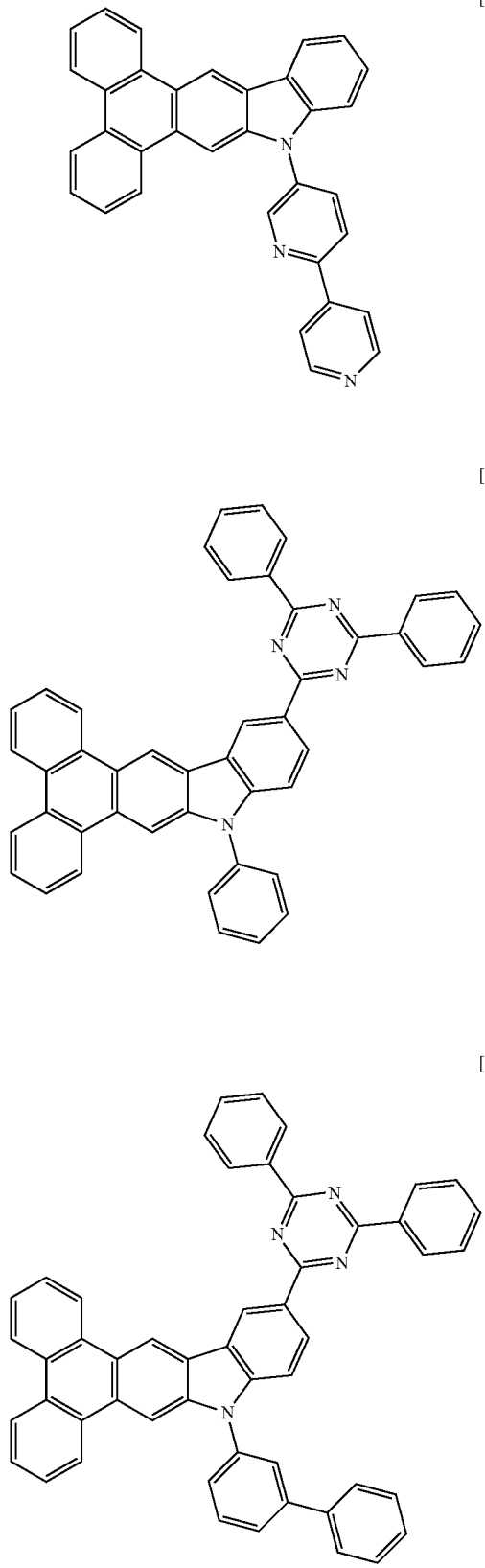

The compounds respectively represented by Chemical Formula 1 and Chemical Formula 2 may be included in an emission layer in a weight ratio of about 5:4 to about 8:1. In such a case, hole mobility and electron mobility may be excellently balanced so that electrochemical stability may be improved. Accordingly, the life-span and efficiency characteristic of an organic light emitting diode display that employs the emission layer may be simultaneously improved. In an implementation, the compound represented by Chemical Formula 1 and the compound represented by Chemical Formula 2 may be included in a weight ratio of about 1:9 to about 9:1.

In an organic light emitting diode device, the life-span may be shortened when luminous efficiency is improved, or luminous efficiency may be deteriorated when the life-span is extended. For Example, the luminous efficiency and the life-span may have a trade-off or inverse relationship. However, when the compound represented by Chemical Formula 1 and the compound represented by Chemical Formula 2 are respectively included in the emission layer in a weight ratio of about 1:9 to about 9:1, e.g., about 5:4 to about 7:2, hole mobility and electron mobility may become excellently balanced so that electrochemical stability may be improved. Accordingly, the luminous efficiency and the life-span may be simultaneously satisfied.

The emission layer 50 may include the compound represented by Chemical Formula 1 and the compound represented by Chemical Formula 2 as host materials. In this case, the emission layer 50 may further include a dopant material. The dopant material may be, e.g., a phosphorescent dopant material. When the dopant material is further included in the emission layer, electrochemical stability of the organic light emitting diode device may be improved, and luminous efficiency may be increased so that current density of the organic light emitting diode display may be reduced, thereby reducing a load in driving of the device. Accordingly, the life-span may be extended.

The emission layer 50 may be a red phosphorescent emission layer, a green phosphorescent emission layer, or a blue phosphorescent emission layer. In an implementation, the emission layer 50 may be the green phosphorescent emission layer.

The red dopant may include, e.g., PtOEP, Ir(piq)₃, Btp₂Ir(acac), DCJTB, or the like.

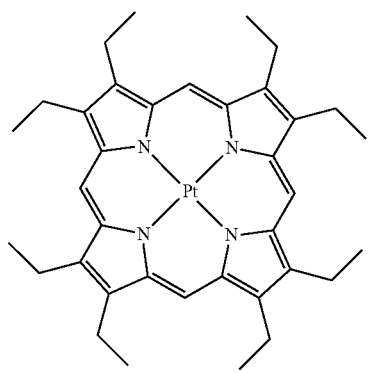

PtOEP

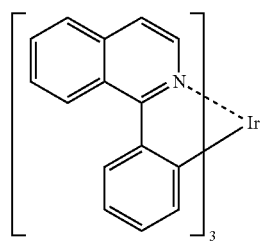

Ir(piq)₃

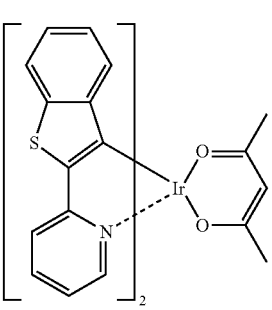

Btp₂Ir(acac)

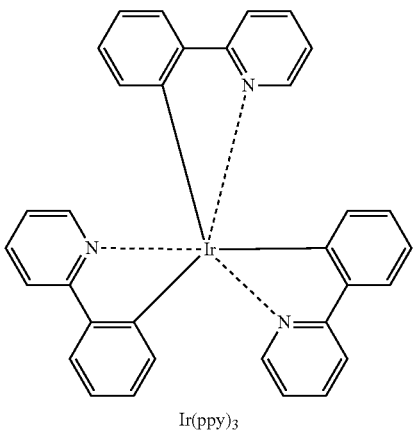

Ir(ppy)₃

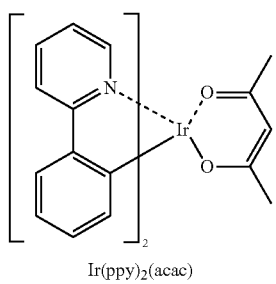

Ir(ppy)₂(acac)

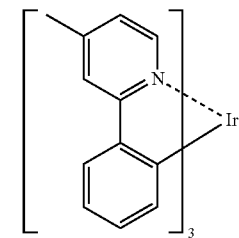

Ir(mpyp)₃

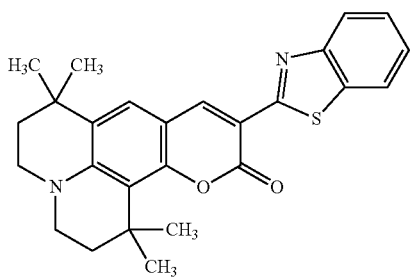

C545T

The green dopant may include, e.g., Ir(ppy)₃ (ppy=phenylpyridine), Ir(ppy)₂(acac), Ir(mpyp)₃, C545T, or the like.

The blue dopant may include, e.g., F₂Irpic, (F₂ppy)₂Ir(tmd), Ir(dfppz)₃, terfluorene, 4,4'-bis (4-diphenylaminostyryl)biphenyl(DPAVBi), 2,5,8,11-tetra-ter-butyl phenylene (TBP), or the like.

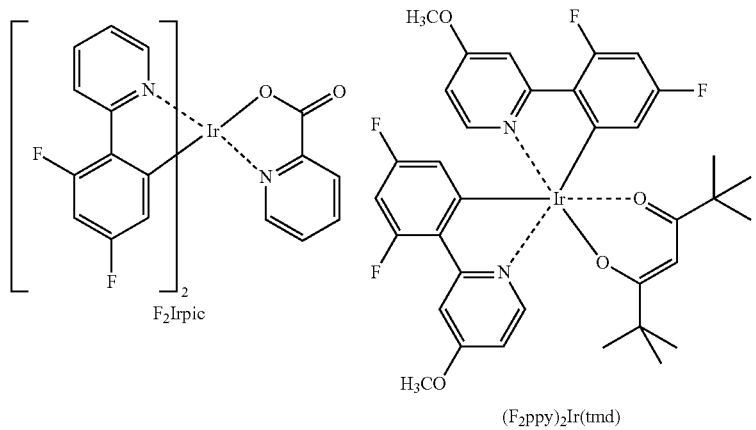
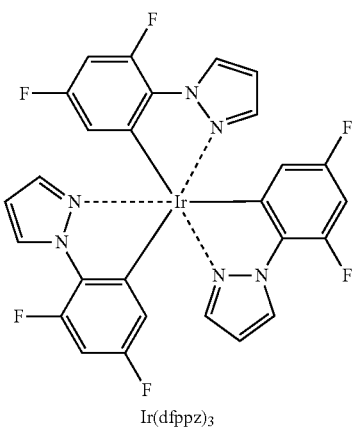

F₂Irpic     (F₂ppy)₂Ir(tmd)     Ir(dfppz)₃

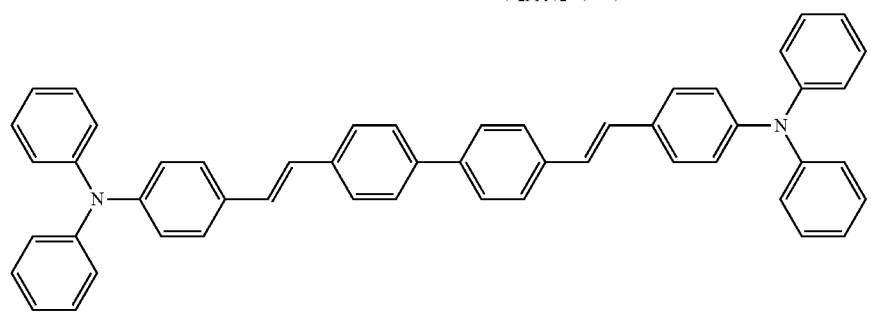

DPAVBi

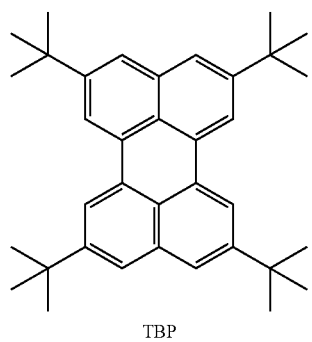

TBP

A content of the host material in the emission layer may be higher than a content of the dopant material in the emission layer. In an implementation, the host material and the dopant material may be included in the emission layer in a weight ratio of about 6:4 to about 9:1. In an implementation, the compound represented by Chemical Formula 1, the compound represented by Chemical Formula 2, and the dopant material may be included in the emission layer in a weight ratio of about 5:4:1 to about 7:2:1.

The emission layer 50 may be formed using various methods, e.g., a vacuum deposition method, a spin coating method, a cast method, an LB method, or the like.

When an organic layer such as the emission layer 50 is formed using the vacuum deposition method, the deposition conditions may vary according to the material that is used to form the organic layer, and the structure and thermal characteristics of the organic layer. For example, the deposition conditions may include a deposition temperature of from about 100° C. to 500° C., a vacuum pressure of about $10^{-8}$ to about $10^{-3}$ torr, and a vacuum rate of from about 0.01 to about 100 Å/sec.

When an organic layer such as the emission layer 50 is formed using the spin coating method, the coating conditions may vary according to the material used to form the organic layer, and the structure and thermal characteristics of the organic layer. For example, the coating conditions may include a coating speed of from about 2000 rpm to about 5000 rpm and a thermal treatment temperature of from about 80° C. to about 200° C. at which the solvent remaining after coating may be removed.

Hereinafter, an organic light emitting diode display according to an exemplary embodiment will be described with reference to FIG. 2.

Referring to FIG. 2, like the organic light emitting diode display according to the above-stated exemplary embodiment, the organic light emitting diode display of the present exemplary embodiment may include an anode 10, a cathode 20, and an emission layer 50 between the anode 10 and the cathode 20.

The organic light emitting diode display of to the present exemplary embodiment may further include a hole transport layer 30 between the anode 10 and the emission layer 50 and/or an electron transport layer 40 between the cathode 20 and the emission layer 50.

The hole transport layer 30 may include a suitable hole transport material, e.g., a carbazole derivate like N-phenylcarbazole, polyvinylcarbazole, 4,4',4"-tris(carbazole-9-yl)-triphenylamine (TCTA), or an amine derivate having an aromatic condensed ring such as NPB, N,N'-bis(3-methylphenyl)-N,N'-diphenyl-[1,1-biphenyl]-4,4'-diamine(TPD). In case of TCTA, the hole transport layer 10 may have a function to help prevent diffusion of excitons from the emission layer in addition to a function of hole transfer.

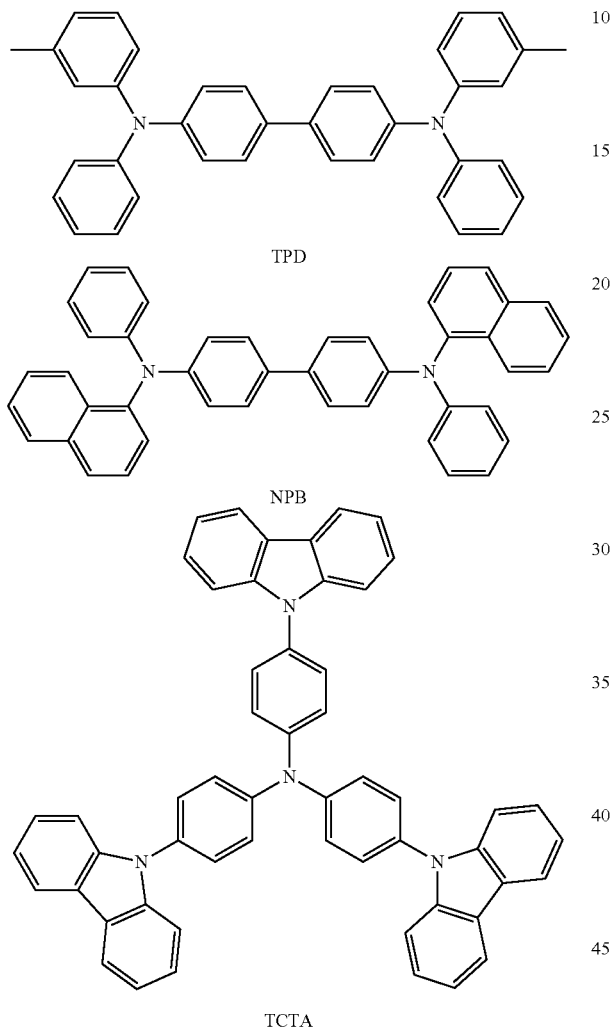

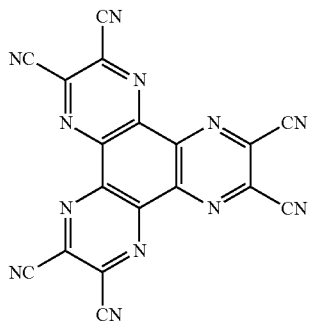

[Compound 100]

When the hole transport layer 30 further includes the auxiliary material, the auxiliary material may be evenly or unevenly dispersed in the layers.

The hole transport layer 30 may be formed in an upper portion of the anode 10 using various methods, e.g., a vacuum deposition method, a spin coating method, an LB method, or the like. When the vacuum deposition method and the spin coating method are used to form the hole transport layer 30, deposition conditions and coating conditions may vary according to a compound that is used to form the hole transport layer 30.

The electron transport layer may be selected from knows materials for forming the electron transport layer. For example, a quinoline derivative such as tris(8-quinolinolate) aluminum $Alq_3$, TAZ, Balq, and the like may be used.

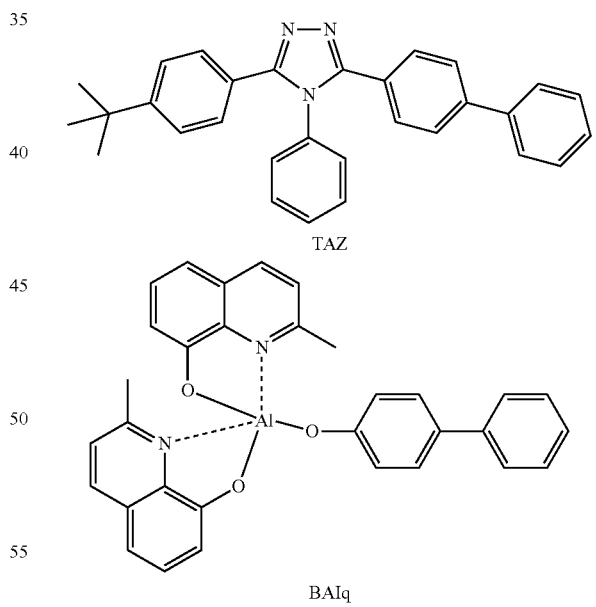

The hole transport layer 30 may have a thickness of about 50 Å to about 1,000 Å, e.g., about 100 Å to about 600 Å. When the thickness of the hole transport layer 30 is within these range, the hole transport layer 30 may have good hole transport characteristics without a substantial increase in a driving voltage.

The hole transport layer 30 may further include an auxiliary material to help improve film conductivity.

The auxiliary material may be, e.g., a p-dopant. Non-limiting examples of the p-dopant may include a quinone derivative such as tetracyanoquino-dimethan (TCNQ) 2,3,5,6-tetrafluoro-tetracyano-1,4-benzoquinondimethane (F4TCNQ), and the like, a metal oxide such as an tungsten oxide, a molybdenum oxide and the like, and a cyano group-containing compound such as the following compound 100.

The thickness of the electron transport layer 40 may be about 100 Å to 1,000 Å, e.g., about 100 Å to about 500 Å. When the thickness of the electron transport layer 40 is within these ranges, the hole transport layer 40 may have good hole transport characteristics without a substantial increase in a driving voltage.

The electron transport layer 40 may include an electron-transporting organic compound and a metal-containing material. Non-limiting examples of the electron-transporting organic compound may include 9,10-di(naphtalene-2-yl) anthracene (ADN) and an anthracene-based compound such as compounds 101 and 102 below.

[Compound 101]

[Compound 102]

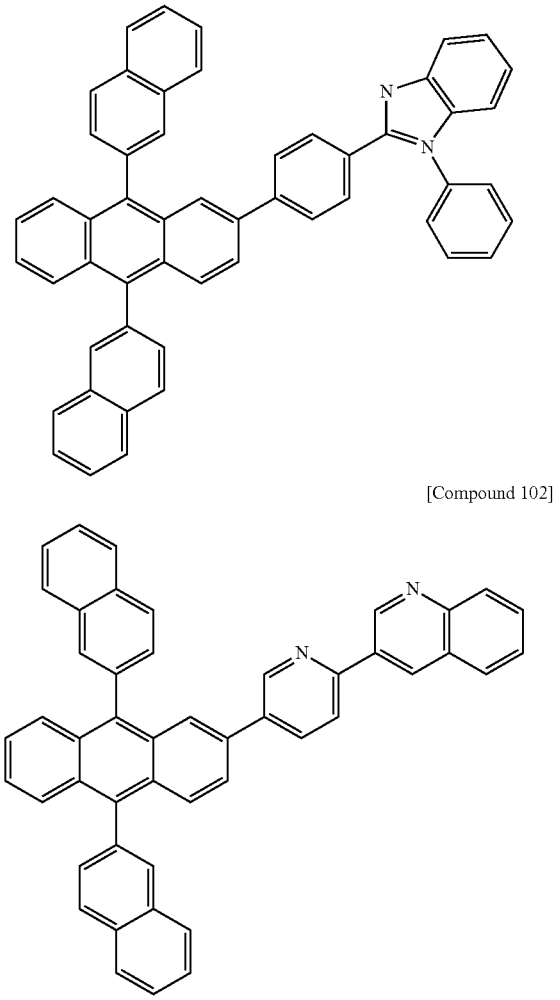

The metal-containing material may include a Li complex. Non-limiting examples of the Li complex may include lithium quinolate (LiQ) or compound 103 below.

[Compound 103]

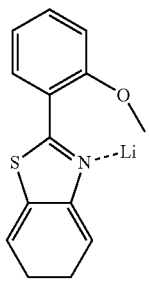

The electron transport layer 40 is formed using various methods, e.g., an vacuum deposition method, a spin coating method, a cast method, and the like. When the vacuum deposition method and the spin coating method are used to form the electron transport layer, the deposition conditions may vary according to a compound that is used to form the electron transport layer 40.

Hereinafter, an organic light emitting diode display according to another exemplary embodiment will be described with reference to FIG. 3.

Referring to FIG. 3, like the organic light emitting diode display of the above-stated exemplary embodiment, the organic light emitting diode display of the present exemplary embodiment may include an anode 10 and a cathode 20 facing each other, an emission layer 50 between the anode 10 and the cathode 20, a hole transport layer 30 between the anode 10 and the emission layer 50, and an electron transport layer 40 between the cathode 20 and the emission layer 50.

The organic light emitting diode display of the present exemplary embodiment may further include a hole injection layer 60 between the anode 10 and the hole transport layer 30 and an electron injection layer 70 between the cathode 20 and the electron transport layer 40.

The hole injection layer 60 may include a hole injection material such as a phthalocyanine compound like copper phthalocyanine, 4,4',4"-tris(3-methylphenylphenylamino) triphenylamine (m-MTDATA), N,N'-di(1-naphthyl)-N,N-diphenylbenzidine (NPB), TDATA, 2T-NATA, polyaniline/ dodecylbenzenesulfonic acid (Pani/DBSA), poly(3,4-ethylenedioxythiophene)/poly(4-styrenesulfonate) (PEDOT/PSS), polyaniline/camphor sulfonicacid: (Pani/CSA), or polyaniline/poly(4-styrenesulfonate) (PANI/PSS).

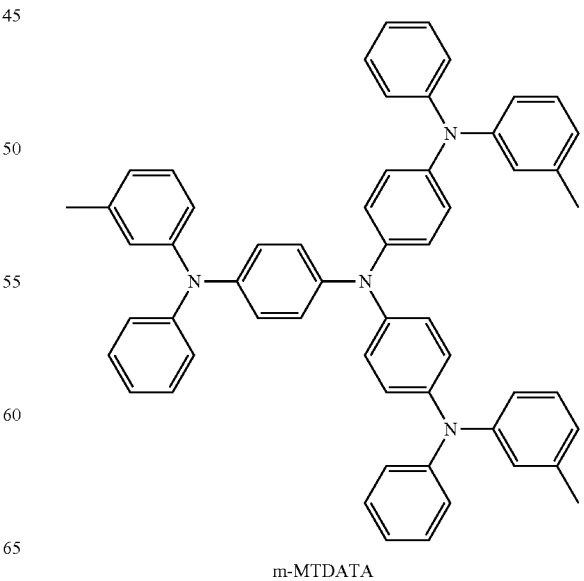

m-MTDATA

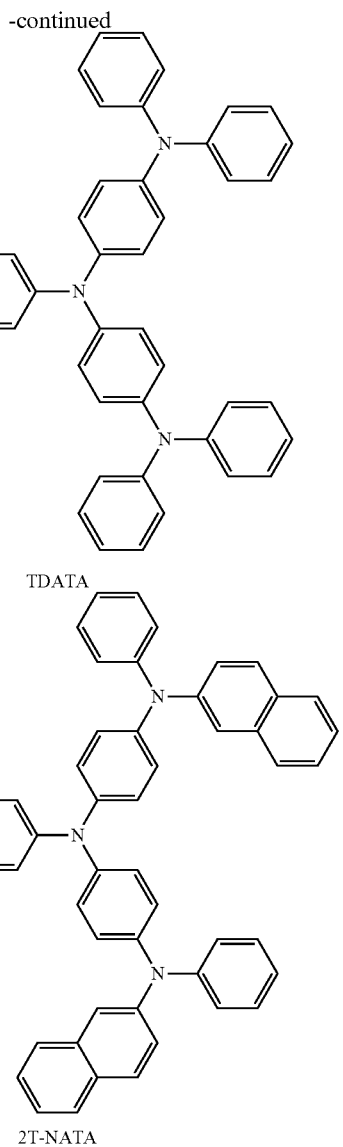

TDATA

2T-NATA

The hole injection layer 60 may have a thickness of about 100 Å to about 10,000 Å, e.g., about 100 Å to about 1,000 Å. When the thickness of the hole injection layer 60 is within these range, the hole injection layer 60 may have good hole injection characteristics without an increase in driving voltage.

When emission layer 50 includes a phosphorescent dopant, a hole blocking layer (not shown) may be formed in an upper portion of the emission layer 50 to help prevent diffusion of triplet-excitons or holes into the electron transport layer 40. In this case, the hole blocking layer may include a suitable material used to form a hole blocking layer. Materials used to form the hole blocking layer may be randomly selected. For example, oxadizole derivatives, triazole derivatives, phenathroline derivatives, Balq, BCP, or the like may be used.

The hole blocking layer may have a thickness of from about 50 Å to about 1,000 Å, e.g., about 100 Å to about 300 Å. Maintaining the thickness of the hole blocking layer at about 50 Å or greater may help prevent a deterioration in hole blocking characteristics. Maintaining the thickness of the hole blocking layer at about 1,000 Å or less may help prevent an increase in driving voltage.

A material for forming the electron injection layer 70 may include suitable materials such as LiF, NaCl, CsF, $Li_2O$, BaO, or the like. The deposition conditions and the coating conditions of the electron injection layer 70 may vary according to a compound that is used to form the electron injection layer 70. For example, the condition range for forming the electron injection layer 70 may be almost the same as the conditions for forming the hole injection layer 60.

The electron injection layer 70 may have a thickness of about 1 Å to about 100 Å, e.g., about 5 Å to about 90 Å. When the thickness of the electron injection layer 70 is within these ranges, the electron injection layer may have good electron injection characteristics without a substantial increase in driving voltage.

For example, the organic light emitting diode display according to the present exemplary embodiment may have an anode/hole injection layer/emission layer/cathode structure, an anode/hole injection layer/hole transport layer/emission layer/electron transport layer structure, or an anode/hole injection layer/hole transport layer/emission layer/electron transport layer/electron injection layer/cathode structure. In an implementation, the organic light emitting diode device may have an anode/function layer simultaneously having hole injection function and hole transport function/emission layer/electron transport layer/cathode structure or an anode/function layer simultaneously having hole injection function and hole transport function/emission layer/electron transport layer/electron injection layer/cathode structure. In an implementation, the organic light emitting diode device may have an anode/hole transport layer/emission layer/function layer simultaneously having electron injection and electron transport function/cathode structure, an anode/hole injection layer/emission layer/function layer simultaneously having electron injection function and electron transport function/cathode structure, or an anode/hole injection layer/hole transport layer/emission layer/function layer simultaneously having electron injection and electron transport function/cathode structure.

In an exemplary embodiment, the organic light emitting diode display may be realized as a front-emission type organic light emitting diode display, a bottom-emission type organic light emitting diode display, or a dual-side emission type organic light emitting diode display.

The organic light emitting diode display according to an exemplary embodiment may be provided in, e.g., a passive matrix organic light emitting diode (OLED) display or active matrix organic light emitting diode (OLED) display. When being provided in the active matrix organic light emitting diode (OLED) display, as a pixel electrode, the anode 10, may be electrically connected to a thin film transistor. In addition, a first layer of the organic light emitting diode display according to an exemplary embodiment may be formed using a vacuum deposition method with the compound represented by Chemical Formula 1 or Chemical Formula 2, or may be formed by using a wet method of coating the compound represented by Chemical Formula 1 or Chemical Formula 2.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Exemplary Embodiment 1

A 15 Ω/cm² 500 Å ITO glass substrate from Corning Inc., was cut into 50 mm×50 mm×0.5 mm size, each ultrasonic wave cleaned for about 10 minutes using isopropyl alcohol and pure water, irradiated with ultraviolet (UV) for 10 minutes and cleaned by being exposed to ozone. Then, the glass substrate is provided in a vacuum deposition device to be used as an anode. A material for a hole injection layer, 2-TNATA (made by DUK SAN hi-metal Co., Ltd.), was vacuum-deposited to an upper portion of the substrate with a thickness of 600 Å. Then, material for a hole transfer compound, 4,4'-bis[N-(1-naphtyl)-N-phenylamino]biphenyle (hereinafter, NPB) (made by DUK SAN hi-metal Co., Ltd.) was vacuum-deposited with a thickness of 300 Å such that a hole transport layer was formed.

In an upper portion of the hole transport layer (HTL), Chemical Formula 1-1 (manufactured by Samsung Display Co., Ltd.), Chemical Formula 2-1 (manufactured by Samsung Display Co., Ltd.), Ir(ppy)₃ [bis-(1-phenylisoquinolyl)iridium(III)acetylacetonate, hereinafter, referred to as D1] (Aldrich Co., Ltd.), which is a green phosphorescent dopant, were simultaneously deposited in a weight ratio of 60:30:10 such that an emission layer was formed. Next, in an upper portion of the emission layer, Alq3 was deposited as an electron transport layer with a thickness of 300 Å and then Al was deposited with a thickness of 1,200 Å (i.e., cathode electrode) to form an Al electrode with a thickness 2,000 Å such that an organic light emitting diode device was manufactured.

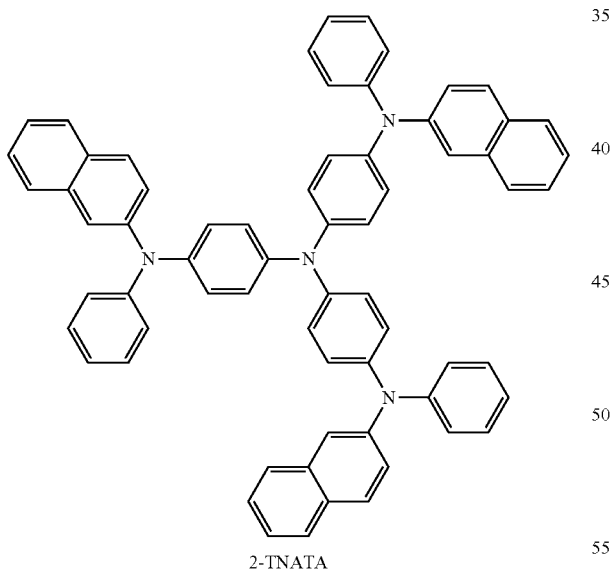

2-TNATA

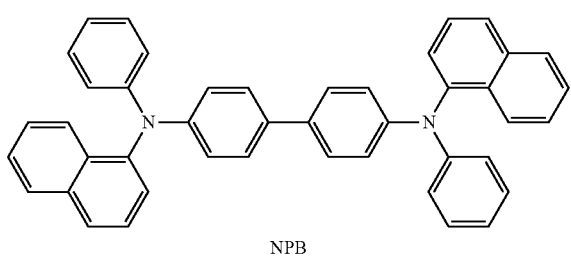

NPB

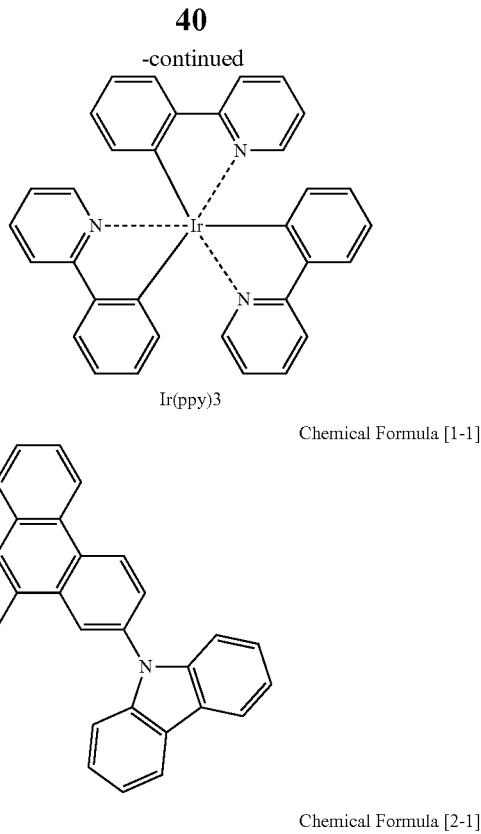

Ir(ppy)3

Chemical Formula [1-1]

Chemical Formula [2-1]

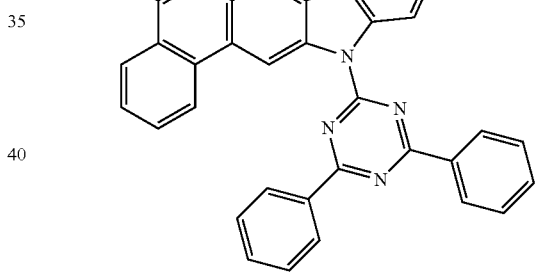

Exemplary Embodiment 2

An organic light emitting diode device was manufactured as in the Exemplary Embodiment 1, except that Chemical Formula 1-1, Chemical Formula 2-1, and D1 were used in a weight ratio 70:20:10 instead of the weight ratio 60:30:10 in forming of the emission layer.

Exemplary Embodiment 3

An organic light emitting diode display was manufactured as in the Exemplary Embodiment 1, except that Chemical Formula 1-2 (Samsung Display Co., Ltd.), Chemical Formula 2-1, and D1 were used in a weight ratio of 50:40:10 in forming of an emission layer instead of using Chemical Formula 1-1, Chemical Formula 2-1, and D1 in the weight ratio of 60:30:10.

Chemical Formula [1-2]

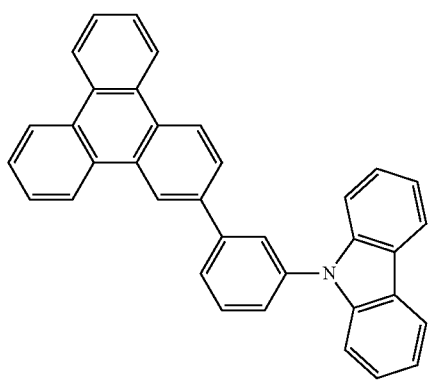

Exemplary Embodiment 4

An organic emission layer emission layer was manufactured as in the Exemplary Embodiment 1, except that Chemical Formula 1-2, Chemical Formula 2-1, and D1 were used in a weight ratio of 70:20:10 in forming the emission layer instead of using Chemical Formula 1-1, Chemical Formula 2-1, and D1 in the weight ratio of 60:30:10.

Exemplary Embodiment 5

An organic light emitting diode display was manufactured as in the Exemplary Embodiment 1, except that Chemical Formula 1-6 (Samsung Display Co., Ltd), Chemical Formula 2-1, and D1 were used in the weight ratio of 60:30:10 instead of using Chemical Formula 1-1, Chemical Formula 2-1, and D1 in the weight ratio of 60:30:10.

Chemical Formula [1-6]

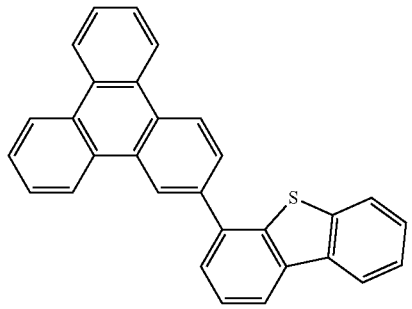

Exemplary Embodiment 6

An organic light emitting diode display was manufactured as in the Exemplary Embodiment 1, except that Chemical Formula 1-6, Chemical Formula 2-1, and D1 were used in a weight ratio of 70:20:10 in forming of an emission layer, instead of using Chemical Formula 1-1, Chemical Formula 2-1, and D1 in the weight ratio of 60:30:10.

Exemplary Embodiment 7

An organic light emitting diode display was manufactured as in the Exemplary Embodiment 1, except that Chemical Formula 1-7 (Samsung Display Co., Ltd.), Chemical Formula 2-1, and D1 were used in a weight ratio of 60:30:10 in forming of an emission layer, instead of using Chemical Formula 1-1, Chemical Formula 2-1, and D1 in the weight ratio of 60:30:10.

Chemical Formula [1-7]

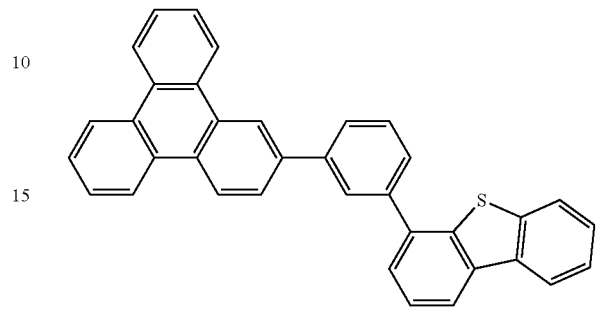

Exemplary Embodiment 8

An organic light emitting diode display was manufactured as in the Exemplary Embodiment 1, except that Chemical Formula 1-7, Chemical Formula 2-1, and D1 were used in a weight ratio of 70:20:10 in forming an emission layer, instead of using Chemical Formula 1-1, Chemical Formula 2-1, and D1 in the weight ratio of 60:30:10.

Exemplary Embodiment 9

An organic light emitting diode display was manufactured as in the Exemplary Embodiment 1, except that Chemical Formula 1-1, Chemical Formula 2-7 (Samsung Display Co., Ltd.), and D1 were used in a weight ratio of 60:30:10 in forming an emission layer, instead of using Chemical Formula 1-1, Chemical Formula 2-1, and D1 in the weight ratio of 60:30:10.

Chemical Formula [2-7]

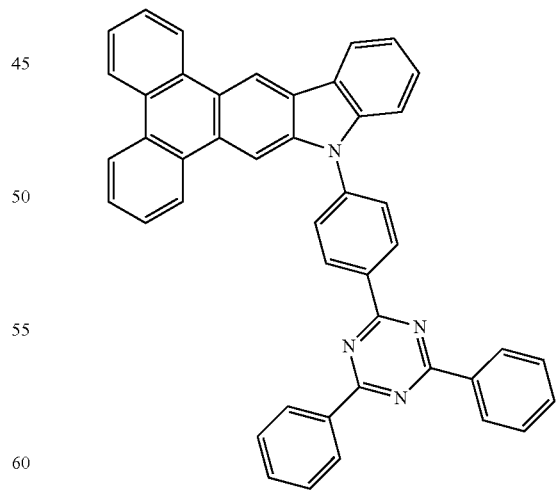

Exemplary Embodiment 10

An organic light emitting diode display was manufactured as in the Exemplary Embodiment 1, except that Chemical Formula 1-1, Chemical Formula 2-7, and D1 were used in a weight ratio of 70:20:10 in forming of an emission layer instead of using Chemical Formula 1-1, Chemical Formula 2-1, and D1 in the weight ratio of 60:30:10.

Exemplary Embodiment 11

An organic light emitting diode display was manufactured as in the Exemplary Embodiment 1, except that Chemical Formula 1-2, Chemical Formula 2-7, and D1 were used in a weight ratio of 60:30:10 in forming of an emission layer instead of using Chemical Formula 1-1, Chemical Formula 2-1, and D1 in the weight ratio of 60:30:10.

Exemplary Embodiment 12

An organic light emitting diode display was manufactured as in the Exemplary Embodiment 1, except that Chemical Formula 1-2, Chemical Formula 2-7, and D1 were used in a weight ratio of 70:20:10 in forming of an emission layer, instead of using Chemical Formula 1-1, Chemical Formula 2-1, and D1 in the weight ratio of 60:30:10.

Exemplary Embodiment 13

An organic light emitting diode display was manufactured as in the Exemplary Embodiment 1, except that Chemical Formula 1-6, Chemical Formula 2-7, and D1 were used in a weight ratio of 60:30:10 in forming of an emission layer, instead of using Chemical Formula 1-1, Chemical Formula 2-1, and D1 in the weight ratio of 60:30:10.

Exemplary Embodiment 14

An organic light emitting diode display was manufactured as in the Exemplary Embodiment 1, except that Chemical Formula 1-6, Chemical Formula 2-7, and D1 were used in a weight ratio of 70:20:10 in forming of an emission layer, instead of using Chemical Formula 1-1, Chemical Formula 2-1, and D1 in the weight ratio of 60:30:10.

Exemplary Embodiment 15

An organic light emitting diode display was manufactured as in the Exemplary Embodiment 1, except that Chemical Formula 1-7, Chemical Formula 2-7, and D1 were used in a weight ratio of 60:30:10 in forming of an emission layer, instead of using Chemical Formula 1-1, Chemical Formula 2-1, and D1 in the weight ratio of 60:30:10.

Exemplary Embodiment 16

An organic light emitting diode display was manufactured as in the Exemplary Embodiment 1, except that Chemical Formula 1-7, Chemical Formula 2-7, and D1 were used in a weight ratio of 70:20:10 in forming of an emission layer, instead of using Chemical Formula 1-1, Chemical Formula 2-1, and D1 in the weight ratio of 60:30:10.

Exemplary Embodiment 17

An organic light emitting diode display was manufactured as in the Exemplary Embodiment 1, except that Chemical Formula 1-1, Chemical Formula 2-11 (manufactured by Samsung Display Co., Ltd.), and D1 were used in a weight ratio of 60:30:10 in forming of an emission layer, instead of using Chemical Formula 1-1, Chemical Formula 2-1, and D1 in the weight ratio of 60:30:10.

Chemical Formula [2-11]

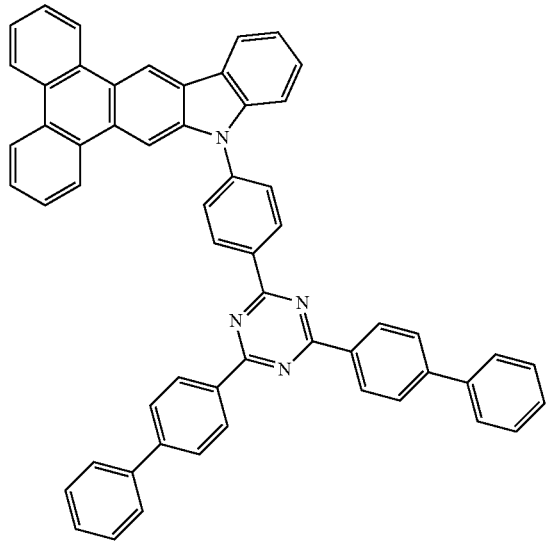

Exemplary Embodiment 18

An organic light emitting diode display was manufactured as in the Exemplary Embodiment 1, except that Chemical Formula 1-1, Chemical Formula 2-11, and D1 were used in a weight ratio of 70:20:10 in forming of an emission layer, instead of using Chemical Formula 1-1, Chemical Formula 2-1, and D1 in the weight ratio of 60:30:10.

Exemplary Embodiment 19

An organic light emitting diode display was manufactured as in the Exemplary Embodiment 1, except that Chemical Formula 1-2, Chemical Formula 2-11, and D1 were used in a weight ratio of 60:30:10 in forming of an emission layer instead, of using Chemical Formula 1-1, Chemical Formula 2-1, and D1 in the weight ratio of 60:30:10.

Exemplary Embodiment 20

An organic light emitting diode display was manufactured as in the Exemplary Embodiment 1, except that Chemical Formula 1-2, Chemical Formula 2-11, and D1 were used in a weight ratio of 70:20:10 in forming of an emission layer, instead of using Chemical Formula 1-1, Chemical Formula 2-1, and D1 in the weight ratio of 60:30:10.

Exemplary Embodiment 21

An organic light emitting diode display was manufactured as in the Exemplary Embodiment 1, except that Chemical Formula 1-6, Chemical Formula 2-11, and D1 were used in a weight ratio of 60:30:10 in forming of an emission layer, instead of using Chemical Formula 1-1, Chemical Formula 2-1, and D1 in the weight ratio of 60:30:10.

Exemplary Embodiment 22

An organic light emitting diode display was manufactured as in the Exemplary Embodiment 1, except that Chemical Formula 1-6, Chemical Formula 2-11, and D1 were used in a weight ratio of 50:40:10 in forming of an emission layer, instead of using Chemical Formula 1-1, Chemical Formula 2-1, and D1 in the weight ratio of 60:30:10.

Exemplary Embodiment 23

An organic light emitting diode display was manufactured as in the Exemplary Embodiment 1, except that Chemical Formula 1-7, Chemical Formula 2-11, and D1 were used in a weight ratio of 60:30:10 in forming of an emission layer, instead of using Chemical Formula 1-1, Chemical Formula 2-1, and the D2 in the weight ratio of 60:30:10.

Exemplary Embodiment 24

An organic light emitting diode display was manufactured as in the Exemplary Embodiment 1, except that Chemical Formula 1-7, Chemical Formula 2-11, and D1 were used in a weight ratio of 70:20:10 in forming of an emission layer, instead of using Chemical Formula 1-1, Chemical Formula 2-1, and D1 in the weight ratio of 60:30:10.

Comparative Example 1

An organic light emitting diode display was manufactured as in the Exemplary Embodiment 1, except that Chemical Formula 1-1 and D1 were used in a weight ratio of 90:10 in forming of an emission layer, instead of using Chemical Formula 1-1, Chemical Formula 2-1, and D1 in the weight ratio of 60:30:10.

Comparative Example 2

An organic light emitting diode display was manufactured as in Comparative Example 1, except that Chemical Formula 1-2 and D1 were used in a weight ratio of 90:10 in forming of an emission layer, instead of using Chemical Formula 1-1 and D1 in the weight ratio of 90:10.

Comparative Example 3

An organic light emitting diode display was manufactured as in Comparative Example 1, except that Chemical Formula 1-6 and D1 were used in a weight ratio of 90:10 in forming of an emission layer, instead of using Chemical Formula 1-1 and D1 in the weight ratio of 90:10.

Comparative Example 4

An organic light emitting diode display was manufactured as in Comparative Example 1, except that Chemical Formula 1-7 and D1 were used in a weight ratio of 90:10 in forming of an emission layer, instead of using Chemical Formula 1-1 and D1 in the weight ratio of 90:10.

Comparative Example 5

An organic light emitting diode display was manufactured as in Comparative Example 1, except that Chemical Formula 2-1 and D1 were used in a weight ratio of 90:10 in forming of an emission layer, instead of using Chemical Formula 1-1 and D1 in the weight ratio of 90:10.

Comparative Example 6

An organic light emitting diode display was manufactured as in Comparative Example 1, except that Chemical Formula 2-7 and D1 were used in a weight ratio of 90:10 in forming of an emission layer, instead of using Chemical Formula 1-1 and D1 in the weight ratio of 90:10.

Comparative Example 7

An organic light emitting diode display was manufactured as in Comparative Example 1, except that CBP (DUK SAN hi-metal Co., Ltd.) and D1 in a weight ratio of 90:10 in forming of an emission layer, instead of using Chemical Formula 1-1 and D1 in the weight ratio of 90:10. In addition, a hole block layer was formed by depositing bis(2-methyl-8-quinolinato) (p-phenylphenolato)aluminum(III) (hereinafter, BAlq) (DUK SAN hi-metal Co., Ltd.) between the emission layer and an electron transport layer.

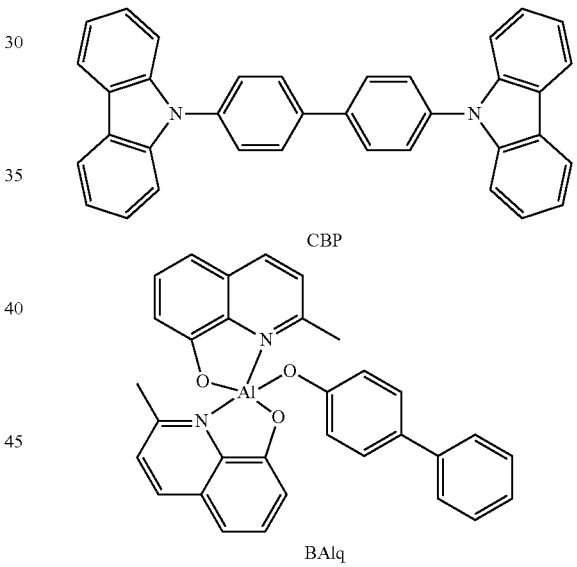

CBP

BAlq

[Evaluation]
Characteristics of the organic light emitting diode displays according to the exemplary embodiments 1 to 24 and the comparative example 1 to 7 were evaluated.
The result of evaluation is as shown in Table 1.

TABLE 1

| | First host (represented by Chemical Formula 1) | Second host (represented by Chemical Formula 2) | Dopant | Ratio (First host: second host: dopant) | Current density (mA/cm$^2$) | Efficiency (cd/A) | Life span (T90%) (h) |
|---|---|---|---|---|---|---|---|
| Exemplary Embodiment 1 | 1-1 | 2-1 | D1 | 60:30:10 | 8 | 26.5 | 150 |
| Exemplary Embodiment 2 | 1-1 | 2-1 | D1 | 70:20:10 | 8 | 26.0 | 190 |
| Exemplary Embodiment 3 | 1-2 | 2-1 | D1 | 50:40:10 | 8 | 24.0 | 160 |
| Exemplary Embodiment 4 | 1-2 | 2-1 | D1 | 70:20:10 | 8 | 25.5 | 175 |

TABLE 1-continued

| | First host (represented by Chemical Formula 1) | Second host (represented by Chemical Formula 2) | Dopant | Ratio (First host: second host: dopant) | Current density (mA/cm$^2$) | Efficiency (cd/A) | Life span (T90%) (h) |
|---|---|---|---|---|---|---|---|
| Exemplary Embodiment 5 | 1-6 | 2-1 | D1 | 60:30:10 | 8 | 24.3 | 136 |
| Exemplary Embodiment 6 | 1-6 | 2-1 | Dl | 70:20:10 | 8 | 24.9 | 166 |
| Exemplary Embodiment 7 | 1-7 | 2-1 | D1 | 60:30:10 | 8 | 22.6 | 120 |
| Exemplary Embodiment 8 | 1-7 | 2-1 | D1 | 70:20:10 | 8 | 24.5 | 134 |
| Exemplary Embodiment 9 | 1-1 | 2-7 | D1 | 60:30:10 | 8 | 21.3 | 120 |
| Exemplary Embodiment 10 | 1-1 | 2-7 | D1 | 70:20:10 | 8 | 22.2 | 90 |
| Exemplary Embodiment 11 | 1-2 | 2-7 | D1 | 60:30:10 | 8 | 22.4 | 110 |
| Exemplary Embodiment 12 | 1-2 | 2-7 | D1 | 70:20:10 | 8 | 23.4 | 120 |
| Exemplary Embodiment 13 | 1-6 | 2-7 | D1 | 60:30:10 | 8 | 23.9 | 136 |
| Exemplary Embodiment 14 | 1-6 | 2-7 | D1 | 70:20:10 | 8 | 22.1 | 115 |
| Exemplary Embodiment 15 | 1-7 | 2-7 | D1 | 60:30:10 | 8 | 23.9 | 126 |
| Exemplary Embodiment 16 | 1-7 | 2-7 | D1 | 70:20:10 | 8 | 23.4 | 110 |
| Exemplary Embodiment 17 | 1-1 | 2-11 | D1 | 60:30:10 | 8 | 21.3 | 96 |
| Exemplary Embodiment 18 | 1-1 | 2-11 | D1 | 70:20:10 | 8 | 22.4 | 91 |
| Exemplary Embodiment 19 | 1-2 | 2-11 | D1 | 60:30:10 | 8 | 20.6 | 99 |
| Exemplary Embodiment 20 | 1-2 | 2-11 | D1 | 70:20:10 | 8 | 22.1 | 142 |
| Exemplary Embodiment 21 | 1-6 | 2-11 | D1 | 60:30:10 | 8 | 20.1 | 120 |
| Exemplary Embodiment 22 | 1-6 | 2-11 | D1 | 50:40:10 | 8 | 19.5 | 100 |
| Exemplary Embodiment 23 | 1-7 | 2-11 | D1 | 60:30:10 | 8 | 22.6 | 80 |
| Exemplary Embodiment 24 | 1-7 | 2-11 | D1 | 70:20:10 | 8 | 22.5 | 88 |
| Comparative Example 1 | 1-1 | — | D1 | 90:0:10 | 8 | 6.0 | 6 |
| Comparative Example 2 | 1-2 | — | D1 | 90:0:10 | 8 | 5.4 | 5 |
| Comparative Example 3 | 1-6 | — | D1 | 90:0:10 | 8 | 2.9 | 9 |
| Comparative Example 4 | 1-7 | — | D1 | 90:0:10 | 8 | 7.0 | 1 |
| Comparative Example 5 | 2-1 | — | D1 | 90:0:10 | 8 | 19.6 | 20 |
| Comparative Example 6 | 2-7 | — | D1 | 90:0:10 | 8 | 18.1 | 26 |
| Comparative Example 7 | CBP | — | D1 | 90:0:10 | 8 | 10.6 | 18 |

(T90% means time h for luminance to be decreased by 90% from the initial luminance of 100% when the organic light emitting diode display is driven while current density of 8 MA/cm$^2$ is continuously applied)

Referring to Table 1, the Exemplary Embodiments 1 to 24 (in which compounds represented by Chemical Formula 1 and Chemical Formula 2 were used as light emission host materials) exhibited improved in efficiency and life-span, when compared to the Comparative Examples 1 to 7 (in which a single light emission host material was used). This may be because that the compound represented by Chemical Formula 2 has good hole and electron injection and transport capabilities, e.g., hole characteristics and electron characteristics are excellent compared to the compound represented by Chemical Formula 1. The compound represented by Chemical Formula 2 may be added to the compound represented by Chemical Formula 1 so that electronic stress applied to the emission layer may be released.

The embodiments may provide an organic light emitting diode display that can improve luminous efficiency and life-span.

Mixture of organic materials having appropriate color coordinates and excellent frame may provide an organic light emitting diode display having advantages of high efficiency, low voltage, high luminance, and long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
an anode;
a cathode facing the anode; and
an emission layer between the anode and the cathode,
wherein the emission layer includes a compound represented by Chemical Formula 1, below, and a compound represented by Chemical Formula 2, below:

[Chemical Formula 1]

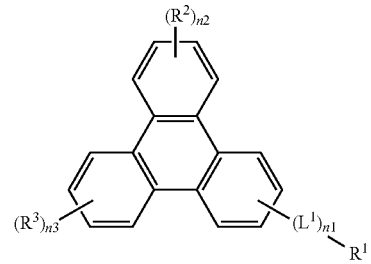

wherein, in Chemical Formula 1, $L^1$ is a substituted or unsubstituted C6 to C30 arylene group or a substituted or unsubstituted C2 to C30 heteroarylene group,
$R^1$ is hydrogen, deuterium, a substituted or unsubstituted C6 to C30 aryl group, a substituted or unsubstituted C2 to C30 heteroaryl group, a substituted or unsubstituted C1 to C30 amine group, or a substituted or unsubstituted silyl group,
$R^2$ and $R^3$ are each independently hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C1 to C30 amine group, or a substituted or unsubstituted silyl group, n1 is an integer from 0 to 2, and n2 and n3 are independently integers from 0 to 4,

[Chemical Formula 2]

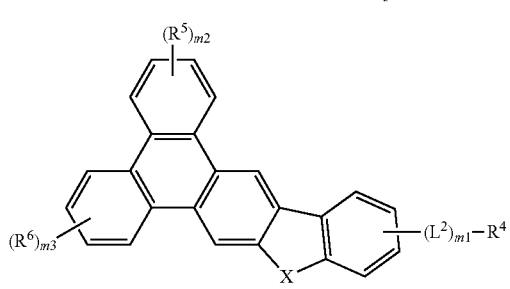

wherein, in Chemical Formula 2,

X is NR, O, or S, in which R is hydrogen, deuterium, a substituted or unsubstituted C1 to C30 alkyl group, a substituted or unsubstituted C6 to C30 aryl group, or a substituted or unsubstituted C2 to C30 heteroaryl group, $R^4$ to $R^6$ are each independently hydrogen, deuterium, a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C1 to C30 amine group, or a substituted or unsubstituted silyl group, $L^2$ is a substituted or unsubstituted C6 to C30 arylene group or a substituted or unsubstituted C2 to C30 heteroarylene group, m1 is an integer from 0 to 2, and m2 and m3 are each independently integers from 0 to 4.

2. The organic light emitting diode display as claimed in claim 1, wherein:

$L^1$ is a substituted or unsubstituted C6 to C30 arylene group, and n2 and n3 are 0.

3. The organic light emitting diode display as claimed in claim 2, wherein $L^1$ is a substituted or unsubstituted phenylene group or a substituted or unsubstituted naphthalene group.

4. The organic light emitting diode display as claimed in claim 1, wherein m2 and m3 are 0.

5. The organic light emitting diode display as claimed in claim 4, wherein R is a substituted or unsubstituted phenyl group, a substituted or unsubstituted pyridinyl group, substituted or unsubstituted pyrimidinyl group, or a substituted or unsubstituted 1,3,5-triazinyl group.

6. The organic light emitting diode display as claimed in claim 4, wherein $R^4$ is a substituted or unsubstituted pyridinyl group, a substituted or unsubstituted pyrimidinyl group, or a substituted or unsubstituted 1,3,5-triazinyl group.

7. The organic light emitting diode display as claimed in claim 1, wherein the compound represented by Chemical Formula 1 is represented by one of Chemical Formula 1-1 to Chemical Formula 1-24, below:

[1-1]
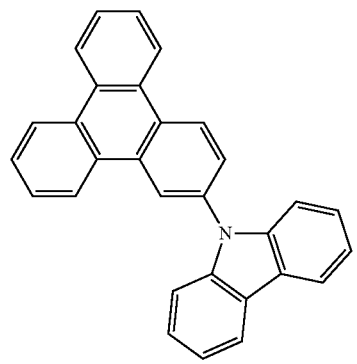

[1-2]
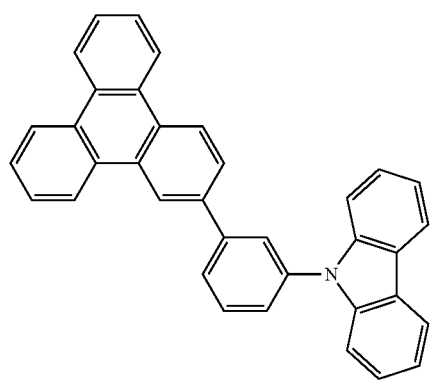

[1-3]
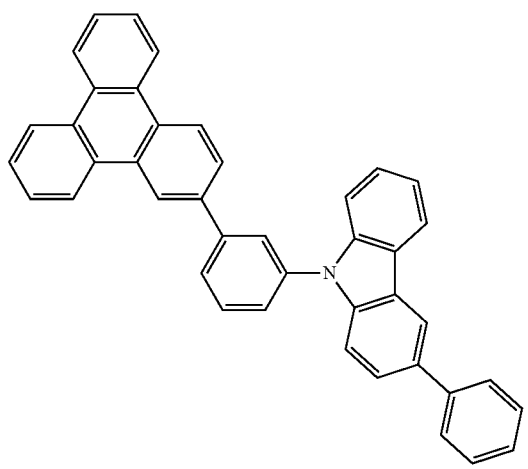

[1-4]
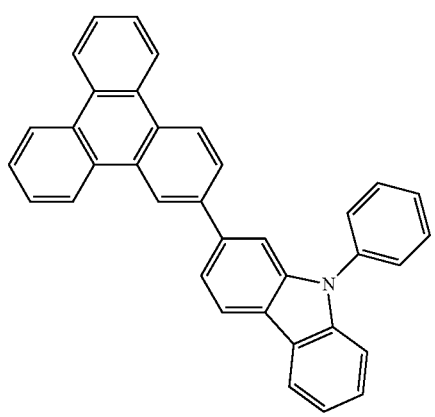

[1-5]
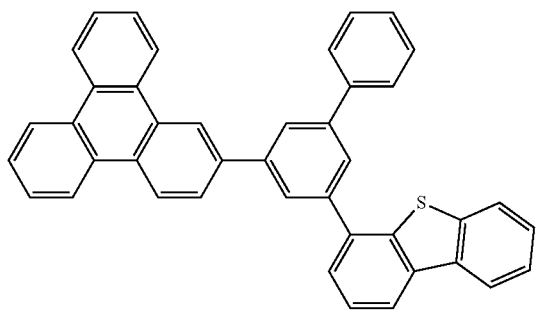
[1-6]
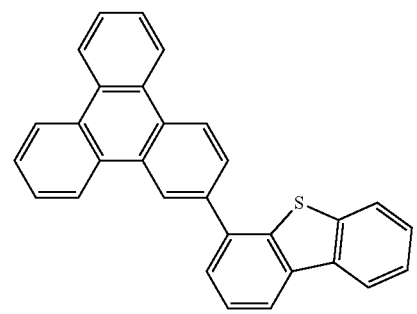
[1-7]
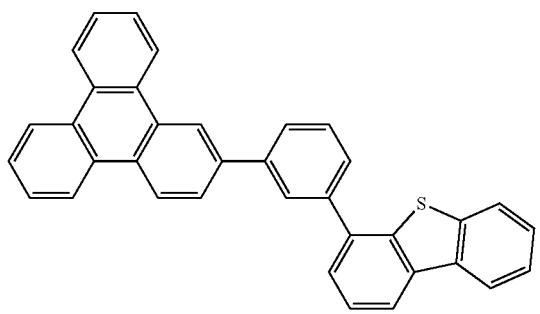
[1-8]
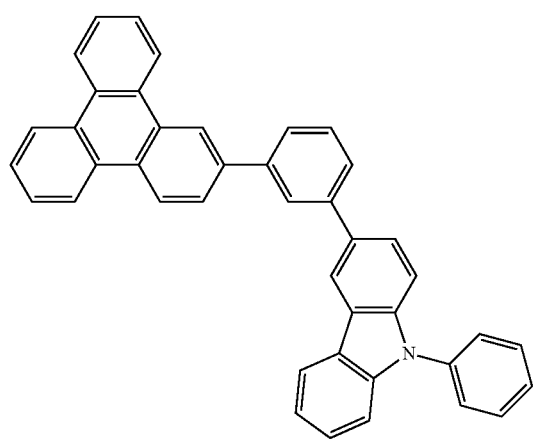
[1-9]
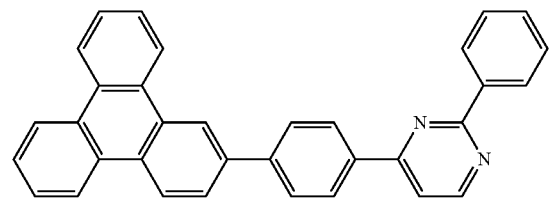
[1-10]
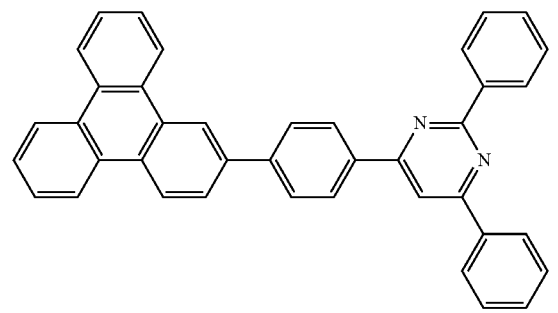
[1-11]
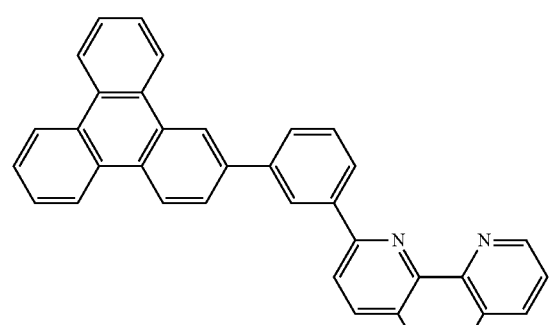
[1-12]
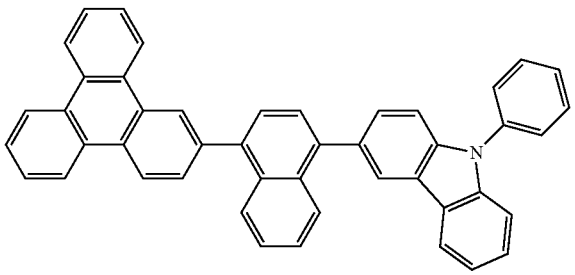
[1-13]
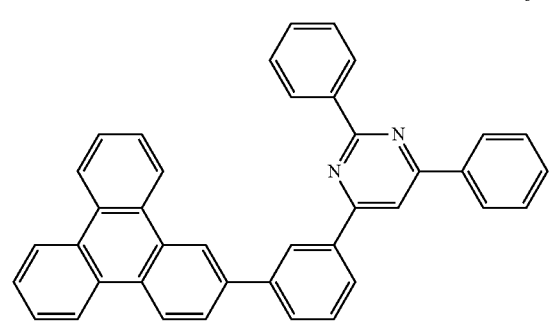

[1-14]
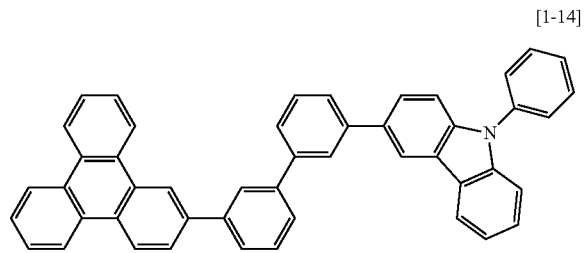
[1-15]
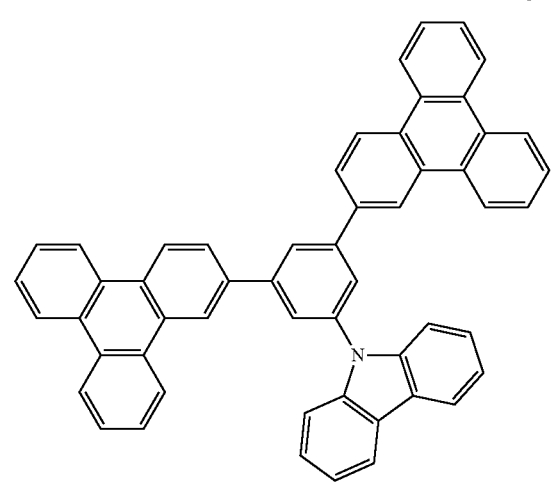
[1-16]
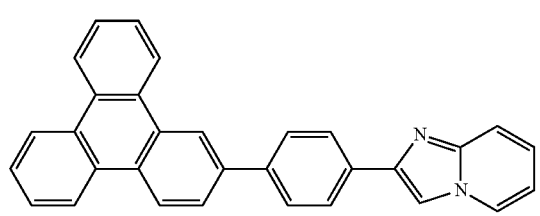
[1-17]
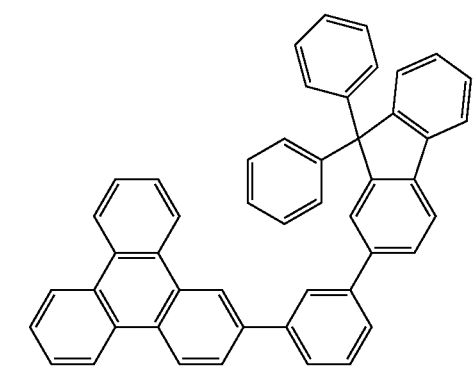
[1-18]
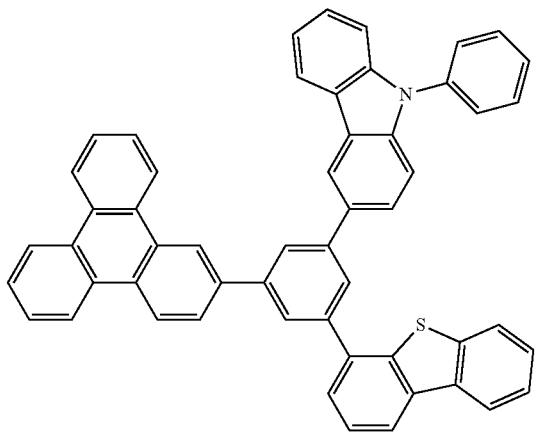
[1-19]
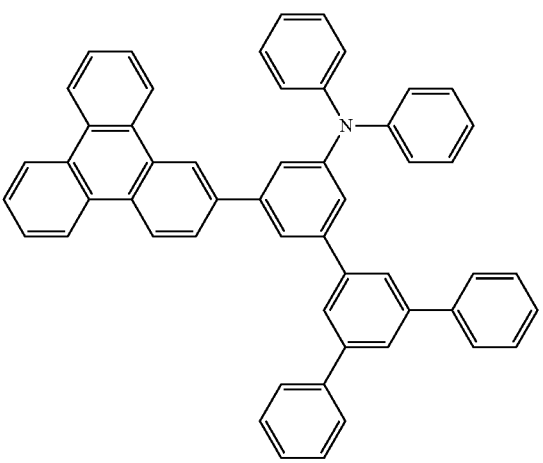
[1-20]
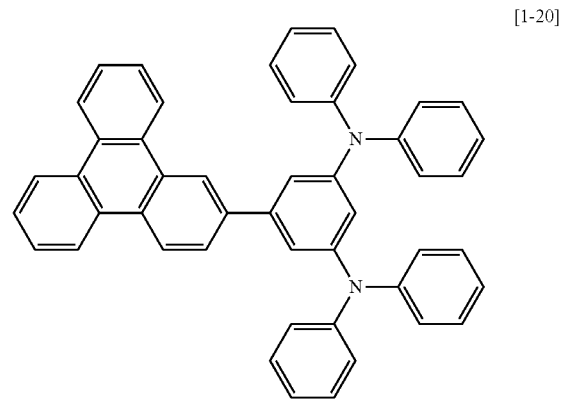
[1-21]
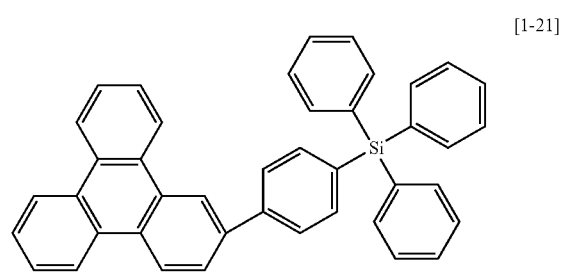

[1-22]
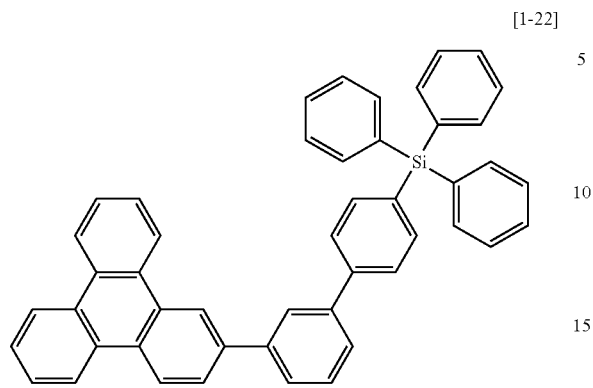
[1-23]
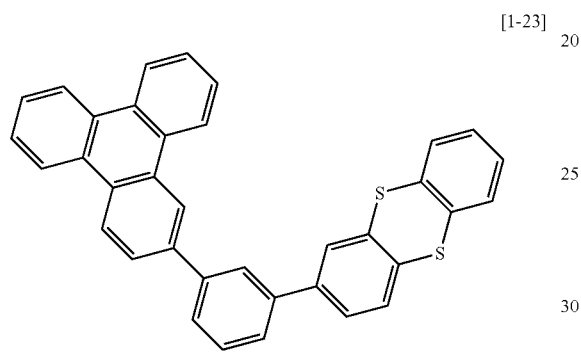
[1-24]
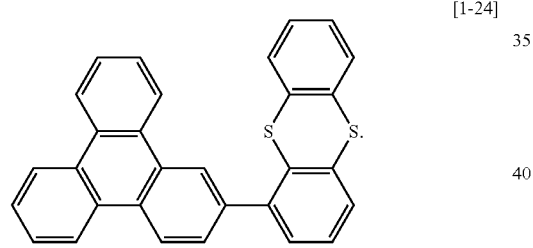
8. The organic light emitting diode display as claimed in claim 1, wherein the compound represented by Chemical Formula 2 is represented by one of Chemical Formula 2-1 to Chemical Formula 2-20, below:
[2-1]
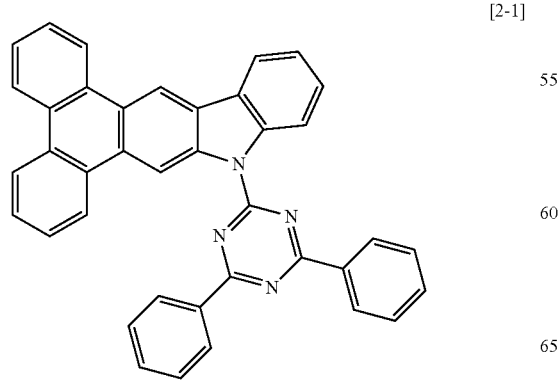
[2-2]
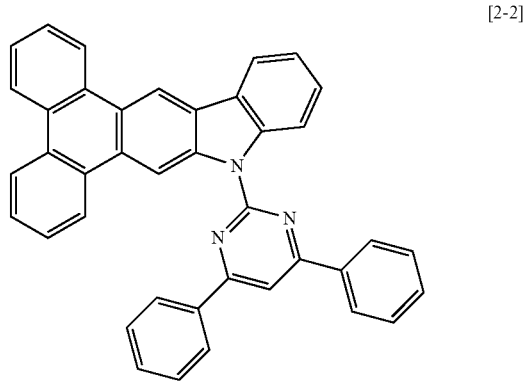
[2-3]
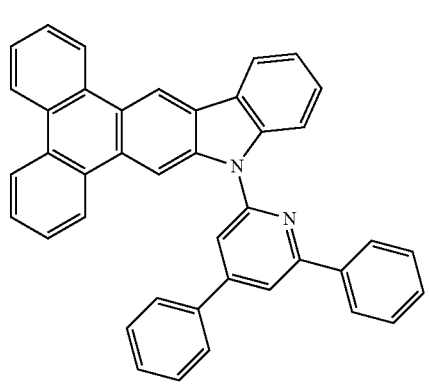
[2-4]
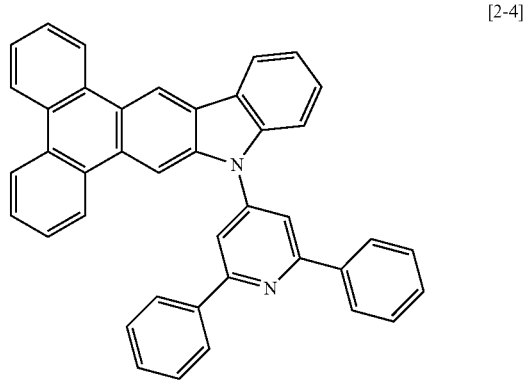
[2-5]
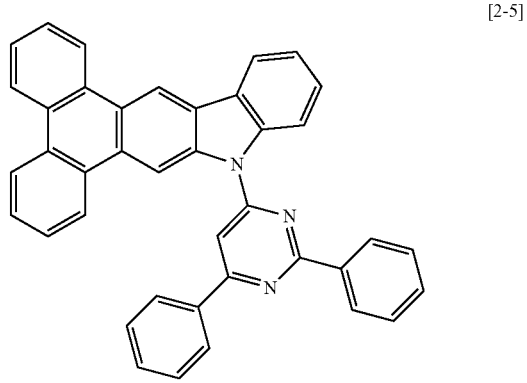

[2-6] 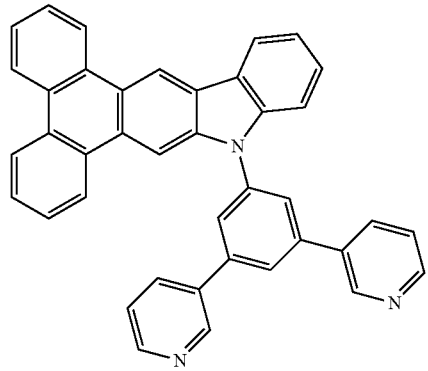
[2-7] 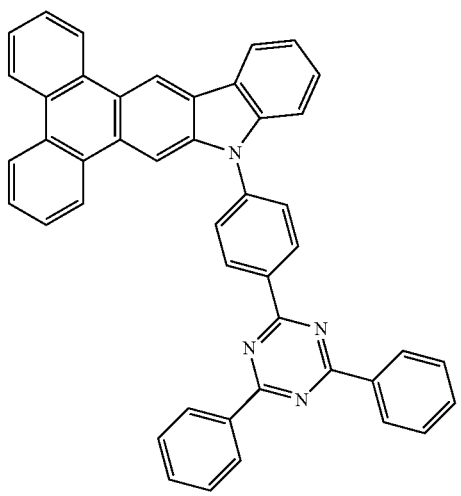
[2-8] 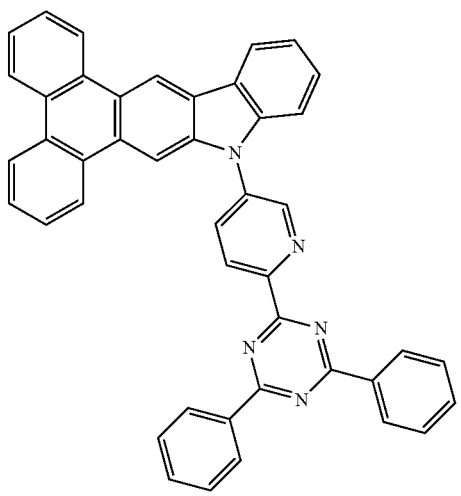
[2-9] 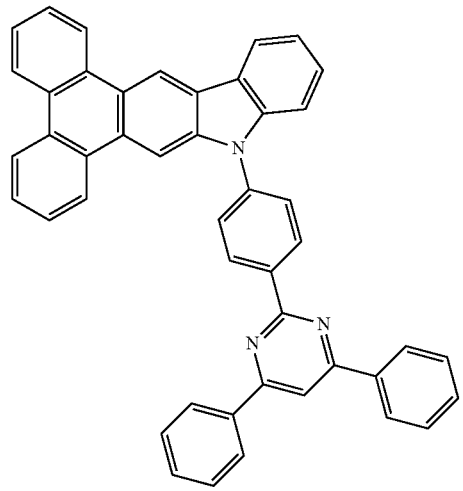
[2-10] 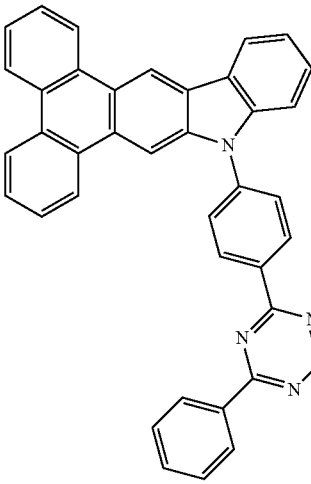
[2-11] 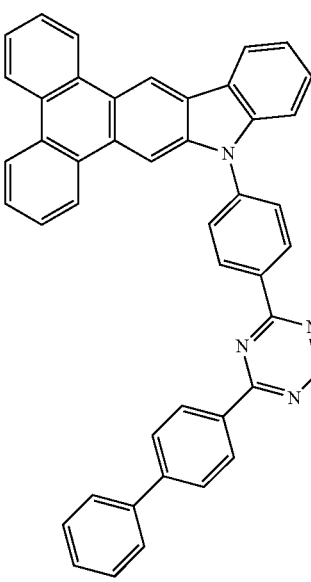

[2-12]
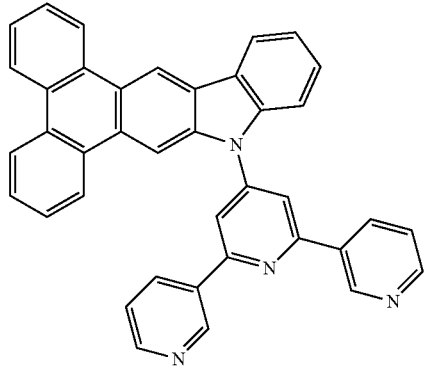
[2-13]
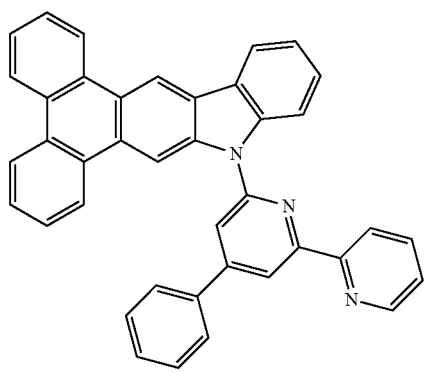
[2-14]
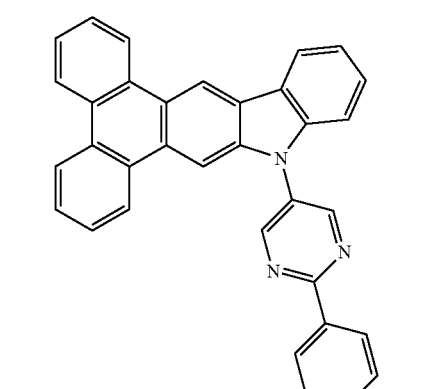
[2-15]
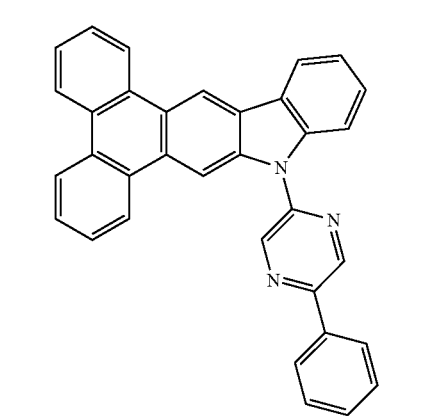
[2-16]
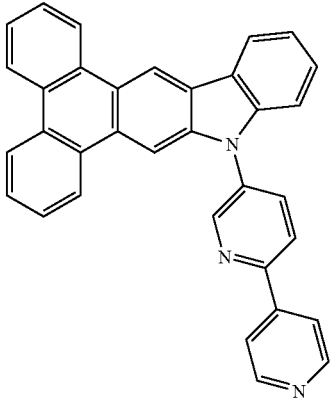
[2-17]
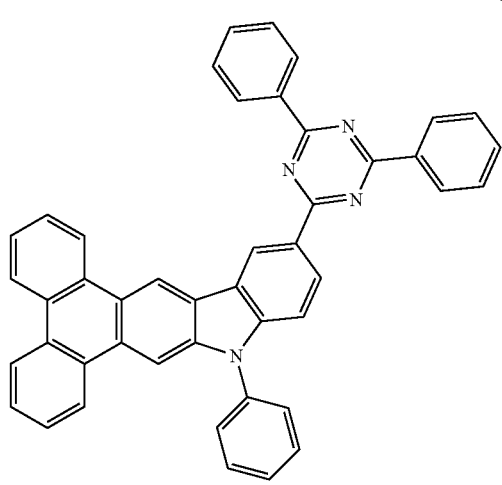
[2-18]
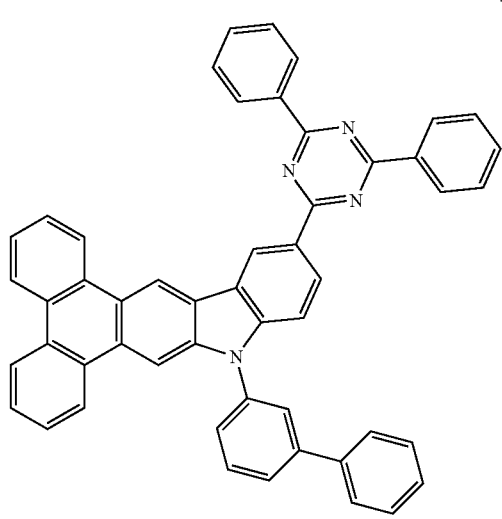

-continued

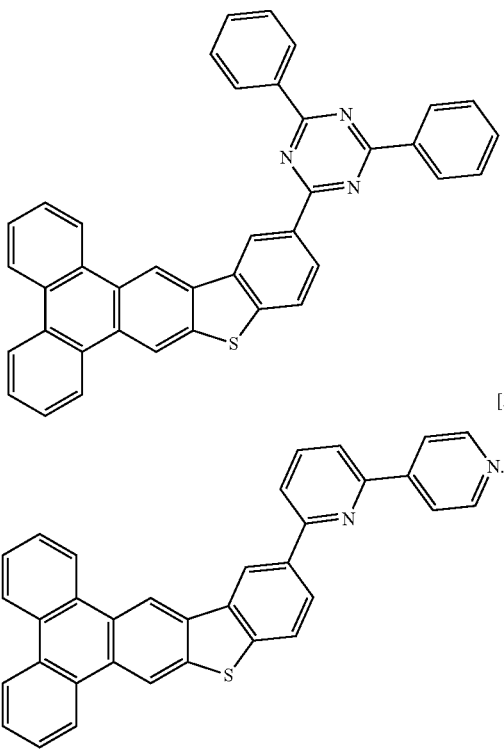

[2-19]

[2-20]

9. The organic light emitting diode display as claimed in claim 1, wherein the emission layer includes the compound represented by Chemical Formula 1 and the compound represented by Chemical Formula 2 as host materials, and further includes a dopant material.

10. The organic light emitting diode display as claimed in claim 9, wherein the dopant material includes a phosphorescent dopant material.

11. The organic light emitting diode display as claimed in claim 9, wherein the compound represented by Chemical Formula 1 and the compound represented by Chemical Formula 2 are present in the emission layer in a weight ratio of about 1:9 to about 9:1.

12. The organic light emitting diode display as claimed in claim 9, wherein the host material and the dopant material are included in the emission layer in a weight ratio of about 6:4 to about 9:1.

13. The organic light emitting diode display as claimed in claim 9, wherein the compound represented by Chemical Formula 1, the compound represented by Chemical Formula 2, and the dopant material are included in the emission layer in a weight ratio of about 5:4:1 to about 7:2:1.

\* \* \* \* \*